US009994439B2

(12) United States Patent
Matsuzawa et al.

(10) Patent No.: US 9,994,439 B2
(45) Date of Patent: Jun. 12, 2018

(54) PRESSURE SENSOR, MANUFACTURING METHOD OF PRESSURE SENSOR, ALTIMETER, ELECTRONIC APPARATUS, AND MOVING OBJECT

(71) Applicant: Seiko Epson Corporation, Tokyo (JP)

(72) Inventors: Yusuke Matsuzawa, Chino (JP); Takuya Kinugawa, Suwa (JP)

(73) Assignee: Seiko Epson Corporation (JP)

( * ) Notice: Subject to any disclaimer, the term of this patent is extended or adjusted under 35 U.S.C. 154(b) by 0 days. days.

(21) Appl. No.: 15/417,674

(22) Filed: Jan. 27, 2017

(65) Prior Publication Data
US 2017/0217755 A1 Aug. 3, 2017

(30) Foreign Application Priority Data

Jan. 28, 2016 (JP) ................... 2016-014062
Mar. 14, 2016 (JP) ................... 2016-049893

(51) Int. Cl.
B81B 3/00 (2006.01)
G01C 5/06 (2006.01)
G01L 9/00 (2006.01)

(52) U.S. Cl.
CPC ............. B81B 3/001 (2013.01); G01C 5/06 (2013.01); G01L 9/0054 (2013.01); B81B 2201/0264 (2013.01); B81B 2207/015 (2013.01); B81C 2203/0728 (2013.01)

(58) Field of Classification Search
CPC ............ B81B 3/001; B81B 2201/0264; B81B 2203/0127; B81B 2207/015; B81B 3/0005; B81B 3/0013; B81C 1/0098; B81C 2201/0105; B81C 2203/0109; B81C 2203/0118; B81C 2203/0172; B81C 2203/0707; B81C 1/00968; B81C 2201/11; B81C 1/00912; B81C 1/0092; B81C 1/00976; B81C 2201/112; B81C 1/00952; B81C 1/0096; B81C 1/00984; B81C 1/00992; G01C 5/06; G01L 9/0054
See application file for complete search history.

(56) References Cited

U.S. PATENT DOCUMENTS

| 2004/0182165 | A1* | 9/2004 | Miyashita | ............ | G01L 9/0042 73/718 |
| 2010/0164028 | A1 | 7/2010 | Adachi et al. | | |
| 2015/0061048 | A1* | 3/2015 | Escher-Poeppel | ..... | H04R 1/021 257/416 |
| 2015/0276527 | A1 | 10/2015 | Takeuchi et al. | | |
| 2016/0153857 | A1* | 6/2016 | Matsuzawa | ........... | G01L 9/0054 73/727 |

FOREIGN PATENT DOCUMENTS

JP 2015-184222 A 10/2015
WO WO-2009-041463 A1 4/2009

* cited by examiner

Primary Examiner — Yasser A Abdelaziez
(74) Attorney, Agent, or Firm — Harness, Dickey & Pierce, P.L.C.

(57) ABSTRACT

A pressure sensor has a substrate having a diaphragm, a cavity portion that is positioned on one side of the diaphragm, and a ceiling portion that is disposed opposite to the diaphragm via the cavity portion, and unevenness is formed on a surface of the substrate facing the cavity portion. In addition, the unevenness has a plurality of recessed portions.

5 Claims, 26 Drawing Sheets

PRESSURE SENSOR, MANUFACTURING METHOD OF PRESSURE SENSOR, ALTIMETER, ELECTRONIC APPARATUS, AND MOVING OBJECT

BACKGROUND

1. Technical Field

The present invention relates to a pressure sensor, a manufacturing method of a pressure sensor, an altimeter, an electronic apparatus, and a moving object.

2. Related Art

In the related art, as a pressure sensor, configurations described in JP-A-2015-184222 and International Publication No. WO2009/041463 are known. The pressure sensor of JP-A-2015-184222 and International Publication No. WO2009/041463 has a substrate having a diaphragm and a surrounding structure disposed on the substrate, and a pressure reference chamber is formed therebetween.

In the pressure sensor having such a configuration, there is a concern that "sticking", in which a ceiling portion (lid portion) is bent and then the ceiling portion comes into contact with the diaphragm or the ceiling portion (lid portion) is attached to the diaphragm as it is and then the ceiling portion is not returned depending on a size (width and height) of the pressure reference chamber and a mechanical strength of the ceiling portion or the lid portion (portion facing diaphragm via the pressure reference chamber) of the pressure reference chamber, occurs. When such a phenomenon occurs, the diaphragm cannot normally deflect and detection accuracy of the pressure deteriorates.

SUMMARY

An advantage of some aspects of the invention is to provide a pressure sensor, in which contact between a ceiling portion (lid portion) and a diaphragm or occurrence of sticking can be reduced, a manufacturing method of a pressure sensor, an altimeter having high reliability, which includes the pressure sensor, an electronic apparatus, and a moving object.

Such an advantage can be achieved by aspects of the invention described below.

A pressure sensor according to an aspect of the invention includes: a substrate that has a diaphragm; a pressure reference chamber that is positioned on one side of the diaphragm; and a ceiling portion that is disposed to face the diaphragm via the pressure reference chamber. Unevenness is formed on at least one of a surface of the substrate facing the pressure reference chamber and a surface of the ceiling portion facing the pressure reference chamber.

With this configuration, it is possible to obtain the pressure sensor in which occurrence of sticking can be reduced.

In the pressure sensor according to the aspect of the invention, it is preferable that the unevenness is formed on the surface of the substrate facing the pressure reference chamber.

With this configuration, the unevenness is easily formed.

In the pressure sensor according to the aspect of the invention, it is preferable that the unevenness has a plurality of recessed portions, and the plurality of recessed portions are opened to the surface of the substrate facing the pressure reference chamber.

With this configuration, the unevenness is easily formed.

In the pressure sensor according to the aspect of the invention, it is preferable that the ceiling portion has a covering layer that covers the pressure reference chamber and has through holes, and a sealing layer that is disposed on the covering layer and seals the through holes, and the unevenness is formed corresponding to disposition of the through holes in a plan view of the substrate.

With this configuration, the unevenness is easily formed.

In the pressure sensor according to the aspect of the invention, it is preferable that a piezo-resistance element is disposed in the diaphragm.

With this configuration, it is possible to easily detect a pressure.

In the pressure sensor according to the aspect of the invention, it is preferable that the surface of the substrate facing the pressure reference chamber has a first region in which the unevenness is formed and a second region in which the unevenness having a density lower than that of the first region is formed, and the piezo-resistance element is disposed over a boundary portion between the first region and the second region.

With this configuration, a stress is easily applied to the piezo-resistance element and detection accuracy of pressure is increased.

In the pressure sensor according to the aspect of the invention, it is preferable that the surface of the substrate facing the pressure reference chamber has a first region in which the unevenness is formed and a second region in which the unevenness is formed, and the piezo-resistance element is disposed over a boundary portion between the first region and the second region.

With this configuration, a stress is easily applied to the piezo-resistance element and detection accuracy of pressure is increased.

A manufacturing method of a pressure sensor according to another aspect of the invention includes: disposing a sacrificial layer on a substrate; disposing a covering layer having through holes on the sacrificial layer; forming a pressure reference chamber and forming unevenness on a surface of the substrate facing the pressure reference chamber by removing the sacrificial layer via the through holes by etching; and sealing the through holes by disposing a sealing layer on the covering layer.

With this configuration, it is possible to obtain the pressure sensor in which occurrence of sticking can be reduced.

An altimeter according to still another aspect of the invention includes the pressure sensor according to the aspect of the invention.

With this configuration, it is possible to obtain the altimeter having high reliability.

An electronic apparatus according to still another aspect of the invention includes the pressure sensor according to the aspect of to the invention.

With this configuration, it is possible to obtain the electronic apparatus having high reliability.

A moving object according to still another aspect of the invention includes the pressure sensor according to the aspect of the invention.

With this configuration, it is possible to obtain the moving object having high reliability.

The advantage described above can also be obtained by aspects of the invention described below.

A pressure sensor according to still another aspect of the invention includes: a substrate that has a diaphragm that is flexibly deformed by receiving a pressure; a pressure reference chamber that is disposed on one surface side of the diaphragm; and a lid portion that is disposed by interposing the pressure reference chamber between the substrate and the lid portion. The lid portion has a portion that is curved so as to protrude on a side opposite to the pressure reference chamber.

With this configuration, it is possible to obtain the pressure sensor in which possibility of contact between the lid portion and the diaphragm can be reduced.

In the pressure sensor according to the aspect of the invention, it is preferable that the lid portion contains silicon.

With this configuration, the lid portion is easily formed by a semiconductor process.

In the pressure sensor according to the aspect of the invention, it is preferable that the lid portion has a protrusion portion that protrudes on the diaphragm side.

With this configuration, even if the lid portion comes into contact with the diaphragm, since it is possible to reduce the contact area, it is possible to reduce sticking.

In the pressure sensor according to the aspect of the invention, it is preferable that the lid portion has lid portion through holes communicating between an inside and an outside of the pressure reference chamber, and a sealing layer that seals the lid portion through holes is disposed on a surface side of the lid portion opposite to the pressure reference chamber.

With this configuration, it is possible to relatively simply seal the lid portion through holes.

In the pressure sensor according to the aspect of the invention, it is preferable that the sealing layer has a base portion that has sealing layer through holes communicating with the lid portion through holes and a sealing portion that seals the sealing layer through holes.

With this configuration, a configuration of the sealing layer becomes relatively simple.

In the pressure sensor according to the aspect of the invention, it is preferable that the base portion contains silicon, and the sealing portion contains at least one of silicon oxide, silicon nitride, and silicon oxynitride.

With this configuration, the sealing layer is easily formed by a semiconductor process.

A manufacturing method of a pressure sensor according to still another aspect of the invention includes: preparing a substrate having a diaphragm forming region; disposing a first sacrificial layer on one surface side of the substrate so as to overlap the diaphragm forming region in a plan view; disposing a second sacrificial layer having through holes facing the first sacrificial layer on a surface side of the first sacrificial layer opposite to the substrate; removing the first sacrificial layer via the through holes; disposing a lid portion that is curved to a surface side of the second sacrificial layer opposite to the substrate so as to protrude on a side opposite to the substrate and has lid portion through holes communicating with the through holes; removing the second sacrificial layer via the lid portion through holes; disposing a sealing layer that seals the lid portion through holes on a surface side of the lid portion opposite to the substrate; and forming a diaphragm that is flexibly deformed by receiving a pressure on the diaphragm forming region of the substrate.

With this configuration, it is possible to easily form the pressure sensor in which contact between the lid portion and the diaphragm can be reduced.

In the manufacturing method of a pressure sensor according to the aspect of the invention, it is preferable that a thermal expansion coefficient of the lid portion is smaller than a thermal expansion coefficient of the second sacrificial layer.

With this configuration, it is possible to cause the lid portion to further reliably be curved so as to be protruded on a side opposite to the substrate.

In the manufacturing method of a pressure sensor according to the aspect of the invention, the lid portion has a tensile stress.

With this configuration, it is possible to cause the lid portion to be further reliably curved so as to protrude on a side opposite to the substrate.

An altimeter according to still another aspect of the invention includes the pressure sensor according to the aspect of the invention.

With this configuration, it is possible to obtain the altimeter having high reliability.

An electronic apparatus according to still another aspect of the invention includes the pressure sensor according to the aspect of the invention.

With this configuration, it is possible to obtain the electronic apparatus having high reliability.

A moving object according to still another aspect of the invention includes the pressure sensor according to the aspect of the invention.

With this configuration, it is possible to obtain the moving object having high reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a pressure sensor, a manufacturing method of a pressure sensor, an altimeter, an electronic apparatus, and a moving object according to the invention will be described with reference to embodiments illustrated in the annexed drawings in detail.

First Embodiment

First, a pressure sensor according to a first embodiment of the invention will be described.

Figure 1:
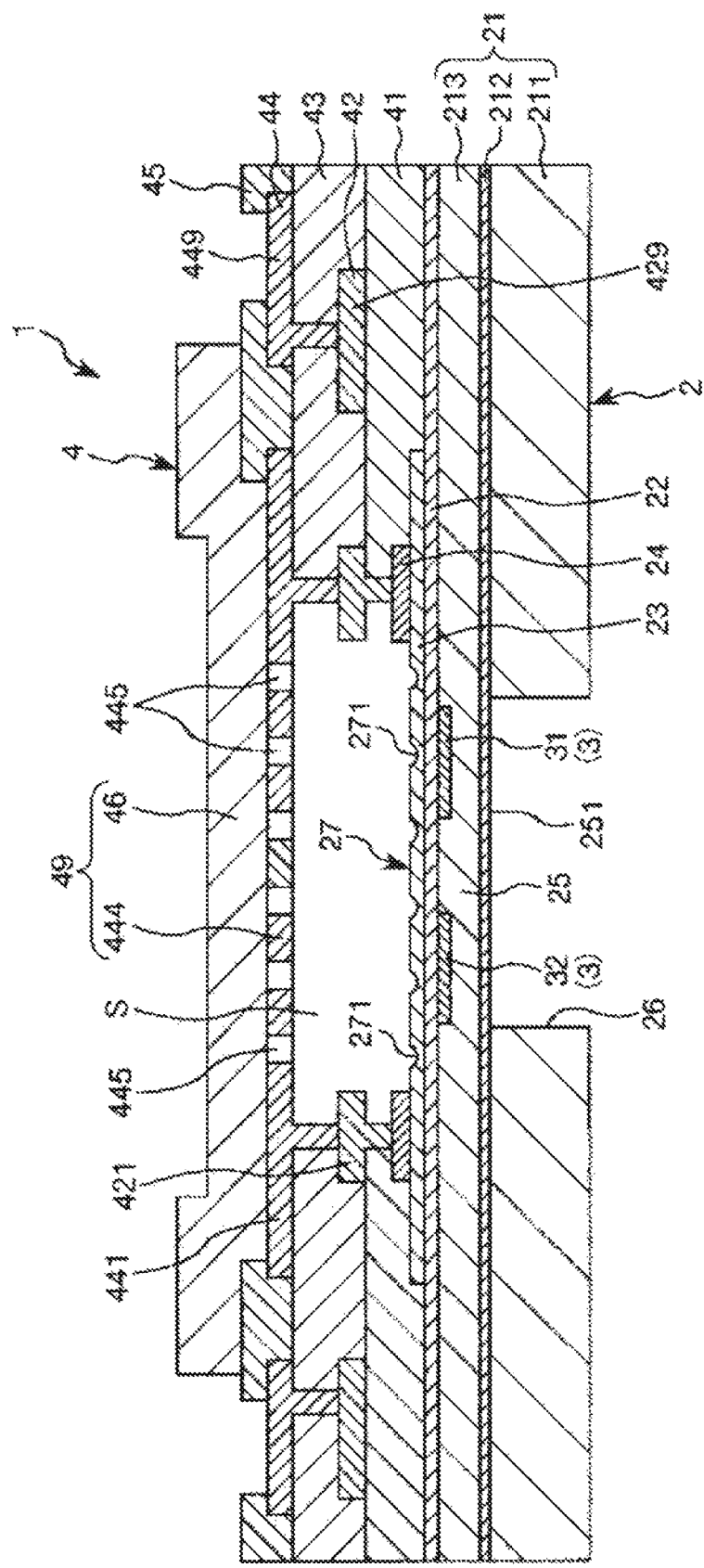
FIG. 1 is a sectional view of a pressure sensor according to a first embodiment of the invention.
Figure 2:
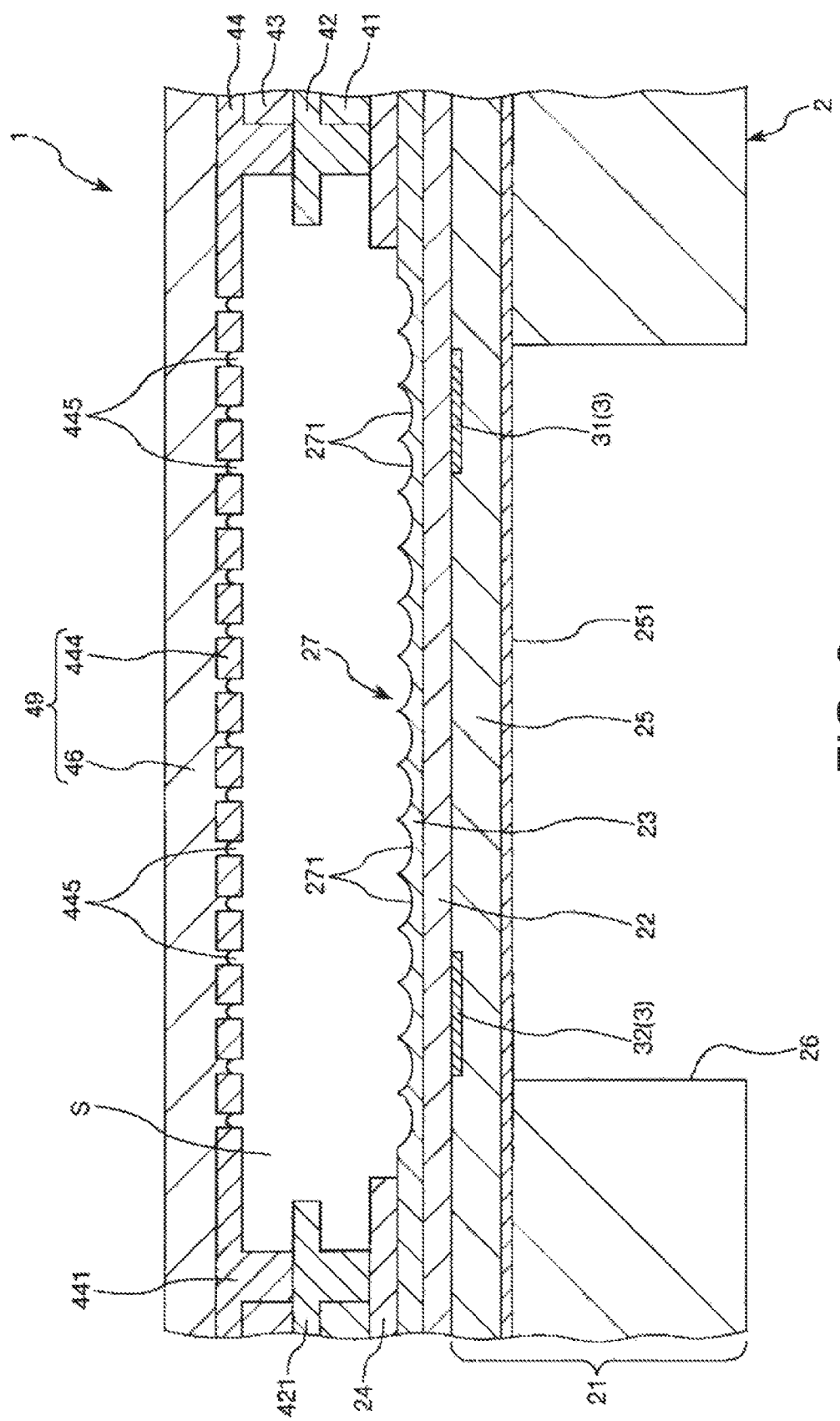
FIG. 2 is a partially enlarged sectional view of the pressure sensor illustrated in FIG. 1.
Figure 3:
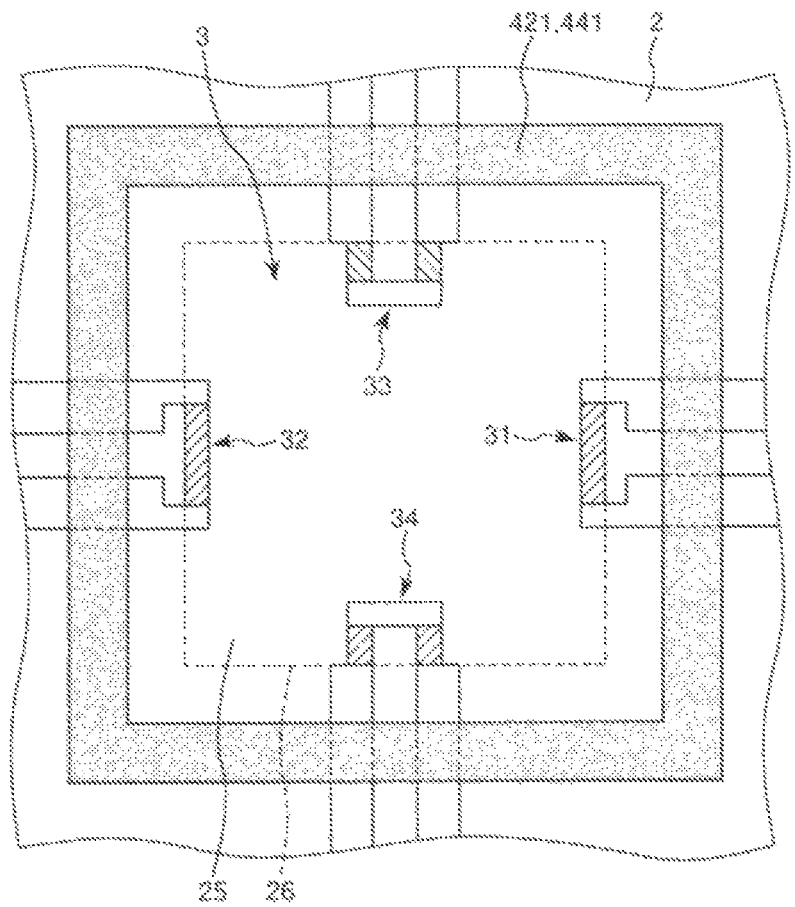
FIG. 3 is a plan view illustrating a pressure sensor portion included in the pressure sensor illustrated in FIG. 1.
Figure 4:
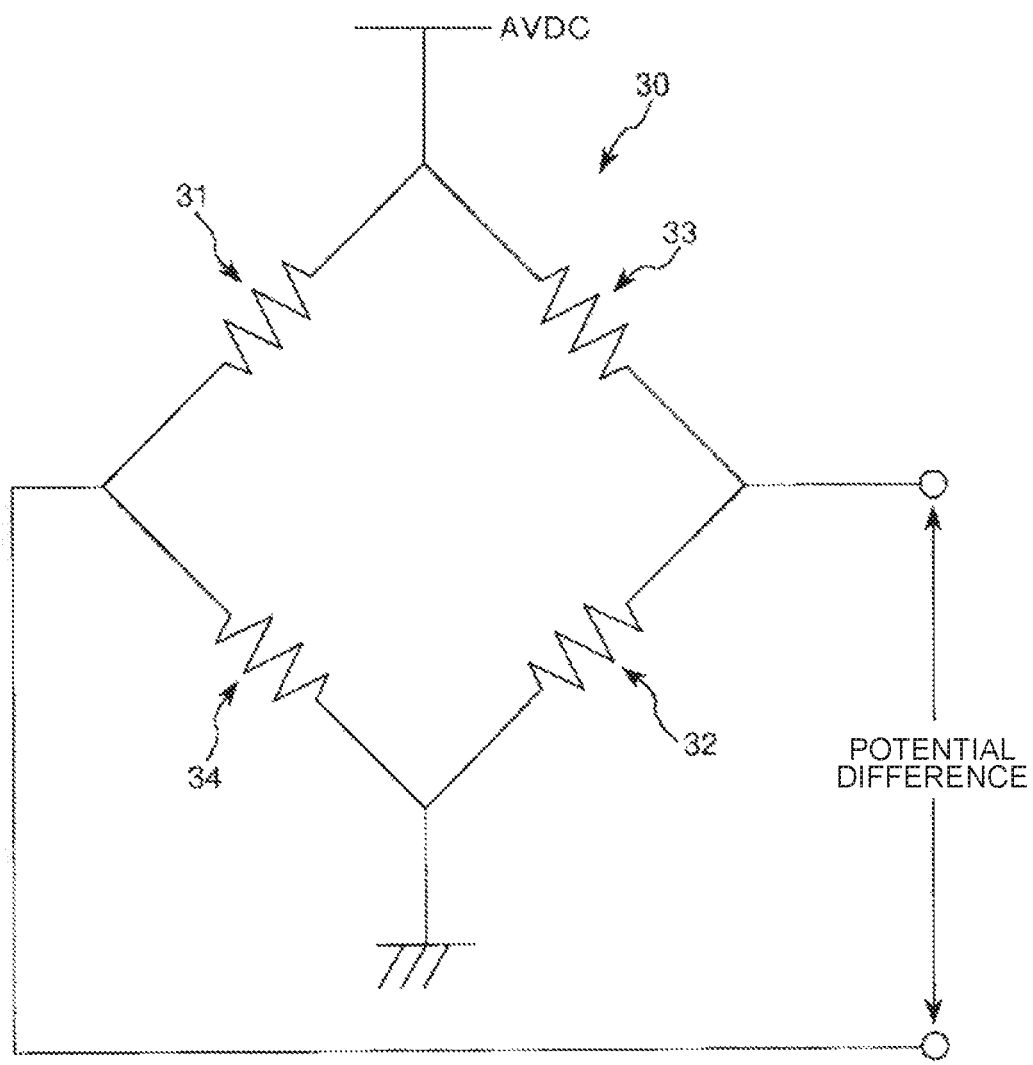
FIG. 4 is a diagram illustrating a bridge circuit including the pressure sensor portion illustrated in FIG. 3.
Figure 5:
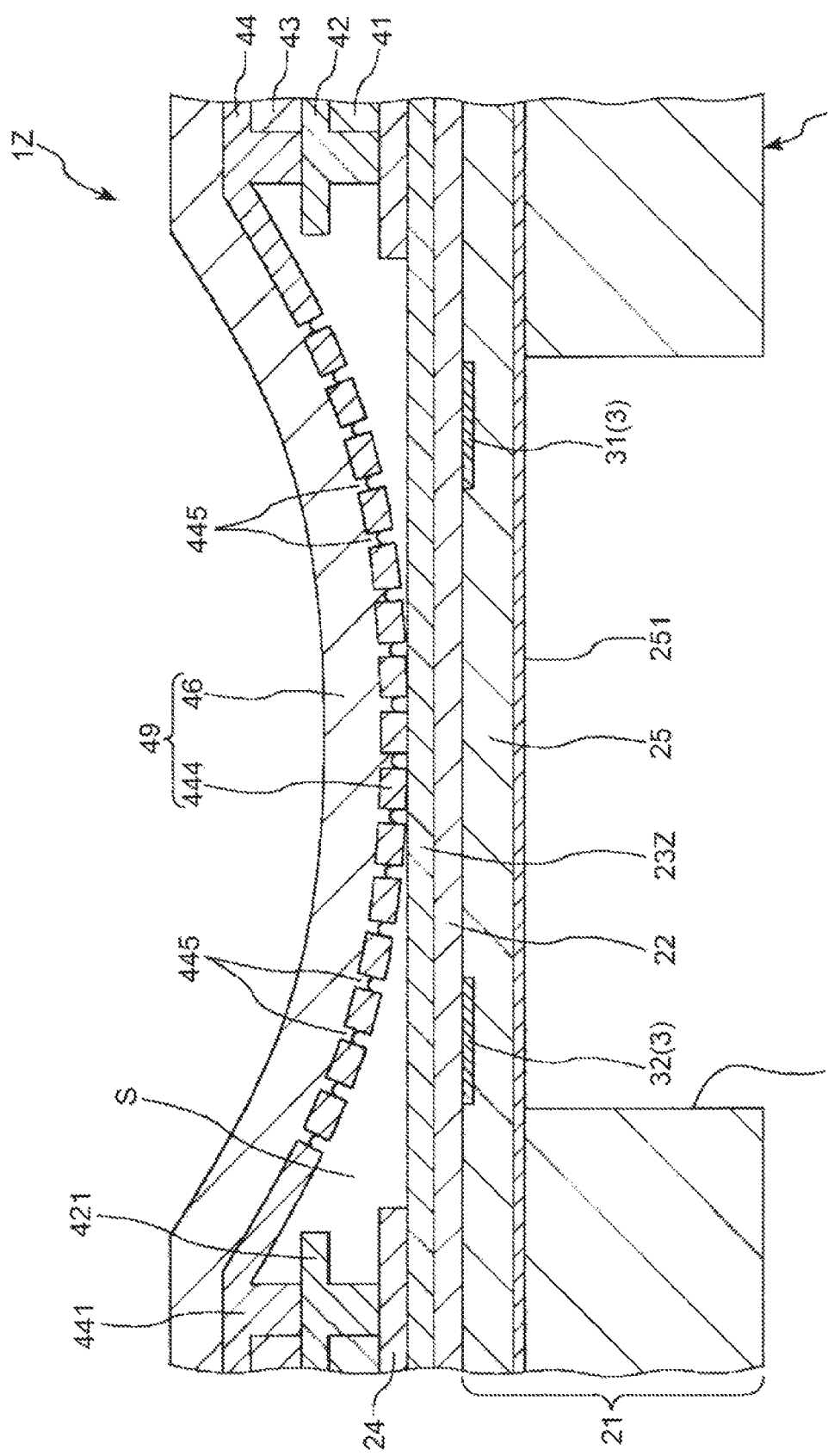
FIG. 5 is a partially enlarged sectional view for explaining a problem of a pressure sensor of the related art.
Figure 6:
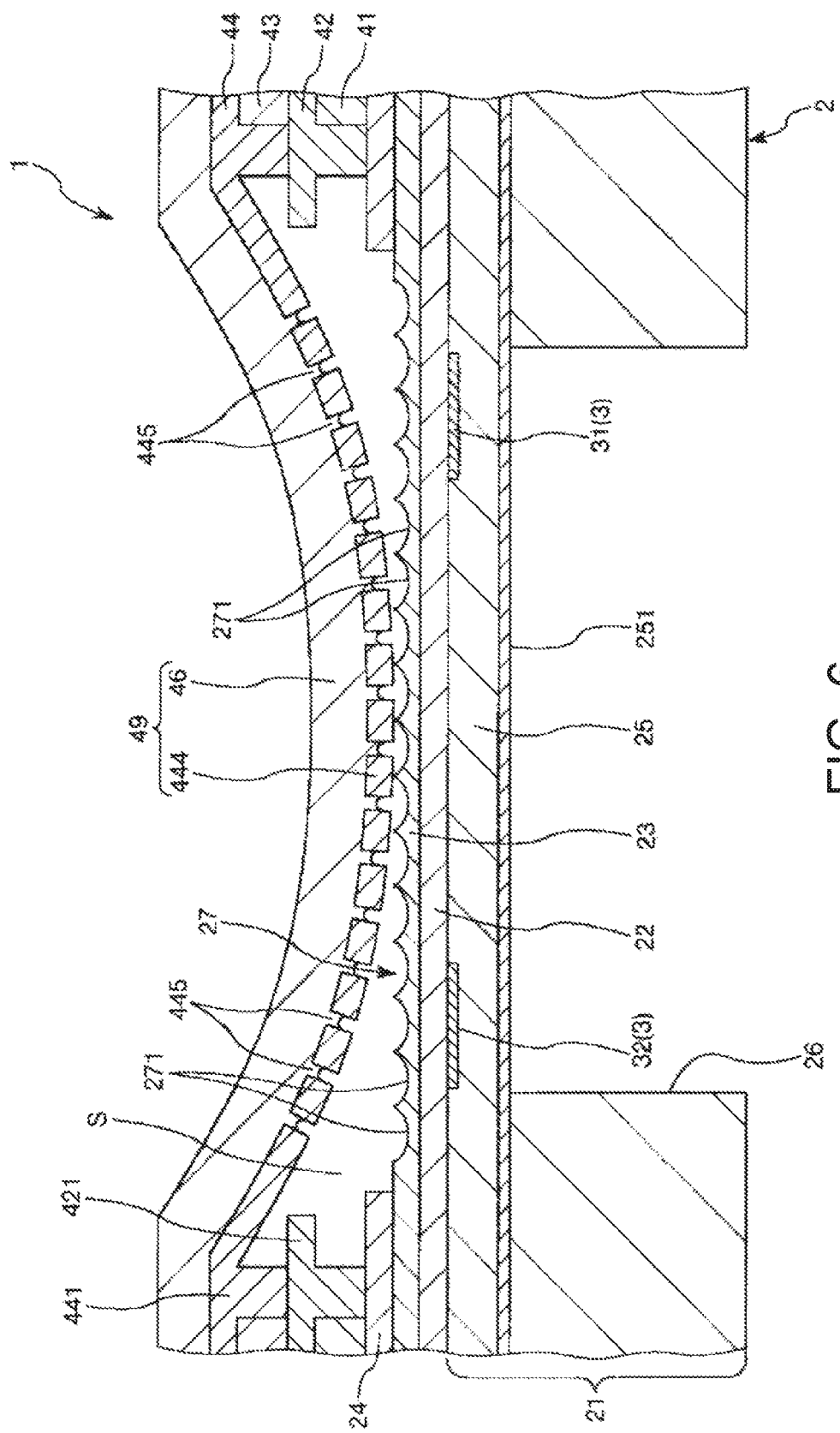
FIG. 6 is a partially enlarged sectional view for explaining an effect of the pressure sensor illustrated in FIG. 1.
Figure 7:
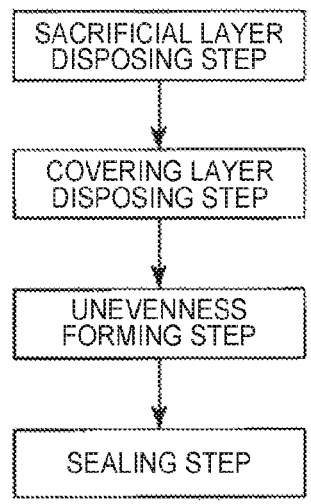
FIG. 7 is a flowchart of a manufacturing method of the pressure sensor illustrated in FIG. 1.

FIG. 1 is a sectional view of the pressure sensor according to the first embodiment of the invention. FIG. 2 is a partially enlarged sectional view of the pressure sensor illustrated in FIG. 1. FIG. 3 is a plan view illustrating a pressure sensor portion included in the pressure sensor illustrated in FIG. 1. FIG. 4 is a diagram illustrating a bridge circuit including the pressure sensor portion illustrated in FIG. 3. FIG. 5 is a partially enlarged sectional view for explaining a problem of a pressure sensor of the related art. FIG. 6 is a partially enlarged sectional view for explaining an effect of the pressure sensor illustrated in FIG. 1. FIG. 7 is a flowchart of a manufacturing method of the pressure sensor illustrated in FIG. 1. FIGS. 8 to 14 are sectional views respectively for explaining the manufacturing method of the pressure sensor illustrated in FIG. 1. Moreover, in the following description, an upper side is also referred to as "upper" and a lower side is also referred to as "lower" in FIG. 1.

A pressure sensor 1 illustrated in FIG. 1 has a substrate 2, a pressure sensor portion 3, a surrounding structure 4, and a cavity portion S. Hereinafter, each of these portions will be described in this order.

Substrate

As illustrated in FIG. 1, the substrate 2 is configured by laminating (forming) a first insulating film 22 that is configured of a silicon oxide film ($SiO_2$ film), a second insulating film 23 that is configured of a silicon nitride film (SiN film), and a polysilicon film 24 on a semiconductor substrate 21 that is a SOI substrate (laminated substrate of first silicon layer 211, a silicon oxide layer 212, and a second silicon layer 213) in this order. However, the semiconductor substrate 21 is not limited to the SOI substrate and, for example, a silicon substrate can be used. In addition, also for the first insulating film 22 or the second insulating film 23, a material is not particularly limited as long as it can exhibit etching resistance and insulating properties. In addition, the first insulating film 22, the second insulating film 23, and the polysilicon film 24 may be provided or may be omitted if necessary.

The semiconductor substrate 21 is provided with a diaphragm 25 that is thinner than a surrounding portion and is flexibly deformed by receiving a pressure. The diaphragm 25 is formed in a bottom portion of a recessed portion 26 by providing the recessed portion 26 having a bottom that is opened to a lower surface of the semiconductor substrate 21 and a lower surface (bottom surface of the recessed portion 26) of the diaphragm 25 serves as a pressure receiving surface 251.

In addition, a semiconductor circuit (circuit) (not illustrated) that is electrically connected to the pressure sensor portion 3 is built on the semiconductor substrate 21 and above the semiconductor substrate 21. The semiconductor circuit includes active elements such as MOS transistors and circuit elements such as capacitors, inductors, resistors, diodes, and wiring which are formed if necessary. However, such a semiconductor circuit may be omitted.

Fine unevenness 27 is formed, as illustrated in FIG. 2, in a region that is an upper surface of the substrate 2 and faces the cavity portion S. As described below, it is possible to reduce sticking of a ceiling portion 49 of the surrounding structure 4 by providing the unevenness 27. Moreover, the unevenness 27 of the embodiment has a plurality of recessed portions 271 that are provided in the second insulating film 23 and are opened to the upper surface of the second insulating film 23. A configuration of the unevenness 27 is simplified and the unevenness 27 is easily formed by providing the unevenness 27 on the upper surface of the substrate 2 and configuring the unevenness 27 with the plurality of recessed portions 271.

In addition, the unevenness 27 is formed corresponding to a plurality of through holes 445 formed in a covering layer 444 described below. Specifically, the recessed portions 271 are formed in positions overlapping the through holes 445 in a plan view of the substrate 2. Formation of the recessed portions 271 is easily performed by disposing the recessed portions 271 in such positions as described in a manufacturing method mentioned later.

Moreover, a depth of the recessed portion 271 is not particularly limited, but, for example, is preferably appropriately 0.01 μm or more and 0.3 μm or less. It is possible to further effectively reduce sticking of the ceiling portion 49 by setting the depth as described above.

In addition, a configuration of the unevenness 27 is not particularly limited and, for example, the recessed portions 271 may be formed over the second insulating film 23 and the first insulating film 22. In addition, the unevenness 27 may have a plurality of protrusion portions provided on the surface of the second insulating film 23.

Pressure Sensor Portion

The pressure sensor portion 3 has, as illustrated in FIG. 3, four piezo-resistance elements 31, 32, 33, and 34 that are provided in the diaphragm 25. In addition, the piezo-resistance elements 31, 32, 33, and 34 are electrically connected to each other via wiring and the like, configure a bridge circuit 30 (Wheatstone bridge circuit) illustrated in FIG. 4, and are connected to a semiconductor circuit.

A drive circuit (not illustrated) for supplying a drive voltage AVDC is connected to the bridge circuit 30. Therefore, the bridge circuit 30 outputs a signal (voltage) depending on a change in resistance values of the piezo-resistance elements 31, 32, 33, and 34 based on deflection of the diaphragm 25. Therefore, it is possible to detect a pressure received by the diaphragm 25 based on the output signal.

The piezo-resistance elements 31, 32, 33, and 34 are respectively configured, for example, by doping (diffusing or injecting) impurity such as phosphorus or boron into the semiconductor substrate 21. In addition, wiring connecting the piezo-resistance elements 31 to 34 is configured, for example, by doping (diffusing or injecting) impurities such as phosphorus and boron into the semiconductor substrate 21 with a higher concentration than that of the piezo-resistance elements 31 to 34.

Cavity Portion

As illustrated in FIG. 1, the cavity portion S is defined by being surrounded by the substrate 2 and the surrounding structure 4. Such a cavity portion S is hermetically sealed space and functions as a pressure reference chamber that is a reference value of a pressure that is detected by the pressure sensor 1. In addition, the cavity portion S is positioned on a side opposite to the pressure receiving surface 251 of the diaphragm 25 and is disposed by overlapping the diaphragm 25 in a plan view. Moreover, it is preferable that the cavity portion S is in a vacuum state (for example, appropriately 10 Pa or less). Therefore, the pressure sensor 1 can be used as a so-called "absolute pressure sensor" that detects a pressure on the basis of vacuum and has high convenience. However, the cavity portion S may not be in the vacuum state as long as the cavity portion S is kept at a constant pressure.

Surrounding Structure

As illustrated in FIG. 1, the surrounding structure 4 defining the cavity portion S together with the substrate 2 has an interlayer insulating film 41, a wiring layer 42 that is disposed on the interlayer insulating film 41, an interlayer insulating film 43 that is disposed on the wiring layer 42 and the interlayer insulating film 41, a wiring layer 44 that is disposed on the interlayer insulating film 43, a surface protection film 45 that is disposed on the wiring layer 44 and the interlayer insulating film 43, and a sealing layer 46 that is disposed on the wiring layer 44 and the surface protection film 45.

The wiring layer 42 has a frame-like wiring portion 421 that is disposed so as to surround the cavity portion S and a circuit wiring portion 429 that configures wiring of the semiconductor circuit. Similarly, the wiring layer 44 has a frame-like wiring portion 441 that is disposed so as to surround the cavity portion S and a circuit wiring portion 449 that configures the wiring of the semiconductor circuit. Thus, the semiconductor circuit is drawn out to the upper surface of the surrounding structure 4 by the circuit wiring portions 429 and 449.

In addition, as illustrated in FIG. 1, the wiring layer 44 has the covering layer 444 that is positioned in a ceiling of the cavity portion S. Therefore, the covering layer 444 is provided with the plurality of through holes (fine holes) 445 communicating between an inside and an outside of the cavity portion S. Such a covering layer 444 is provided extending from the wiring portion 441 to the ceiling of the cavity portion S and is disposed to face the diaphragm 25 in which the cavity portion S is interposed therebetween. The plurality of through holes 445 are holes for release etching for allowing an etching solution to enter the cavity portion S as described below in the manufacturing method. In addition, the sealing layer 46 is disposed on the covering layer 444 and the through holes 445 are sealed by the sealing layer 46. Moreover, in the following description, a laminated body of the covering layer 444 and the sealing layer 46 may be referred to as the "ceiling portion 49".

Here, there is a concern that the ceiling portion 49 is temporarily bent and comes into contact with the substrate 2 (second insulating film 23 provided on the diaphragm 25) depending on a size (flat area) of the cavity portion S, a thickness (mechanical strength) of the ceiling portion 49, a surrounding pressure, and the like. In addition, as illustrated in FIG. 5, in a pressure sensor 1Z of the related art, since a second insulating film 23Z on an upper surface of a substrate 2 is flat, if a ceiling portion 49 comes into contact with the substrate 2, there is a concern that sticking occurs and a ceiling portion 49 is attached to the substrate 2 as it is due to a size of a contact area. As described above, if sticking occurs, since a diaphragm 25 is not normally curved or deformed according to the received pressure, detection accuracy of the pressure is remarkably lowered.

In response to such a problem, in the pressure sensor 1 of the embodiment, since the unevenness 27 is provided on the upper surface of the substrate 2, as illustrated in FIG. 6, even if the ceiling portion 49 comes into contact with the substrate 2, the contact area of the substrate 2 can be kept small. Therefore, it is possible to reduce sticking of the ceiling portion 49 and to reduce degradation of the detection accuracy of the pressure. Moreover, in the embodiment, the unevenness 27 is disposed over an entire region of the upper surface (region facing the cavity portion S) of the substrate 2, but the disposition of the unevenness 27 is not limited to the embodiment. For example, the unevenness 27 may be disposed only at a center portion overlapping the diaphragm 25 in a plan view. This is because the center portion of the ceiling portion 49 is most likely to come into contact with the substrate 2.

The surface protection film 45 has a function of protecting the surrounding structure 4 from moisture, dust, scratches, and the like. Such a surface protection film is disposed on the interlayer insulating film 43 and the wiring layer 44 so as not to block the through holes 445 of the covering layer 444.

In such a surrounding structure 4, as the interlayer insulating films 41 and 43, for example, it is possible to use an insulating film such as silicon oxide film ($SiO_2$ film). In addition, as the wiring layers 42 and 44, for example, it is possible to use a metal film such as an aluminum film. In addition, as the sealing layer 46, for example, it is possible to use a metal film such as Al, Cu, W, Ti, and TiN, a silicon oxide film, and the like. In addition, as the surface protection film 45, for example, it is possible to use a silicon oxide film, a silicon nitride film, a polyimide film, an epoxy resin film, and the like.

Next, the manufacturing method of the pressure sensor 1 will be described. As illustrated in FIG. 7, the manufacturing method of the pressure sensor 1 includes a sacrificial layer disposing step in which a sacrificial layer 48 is disposed on the substrate 2, a covering layer disposing step in which the covering layer 444 is disposed on the sacrificial layer 48, an unevenness forming step in which the cavity portion S is formed and the unevenness 27 is formed by removing the sacrificial layer 48 via the through holes 445 by etching, and a sealing step in which the through holes 445 are sealed by disposing the sealing layer 46 on the covering layer 444.

Sacrificial Layer Disposing Step and Covering Layer Disposing Step

Figure 8:
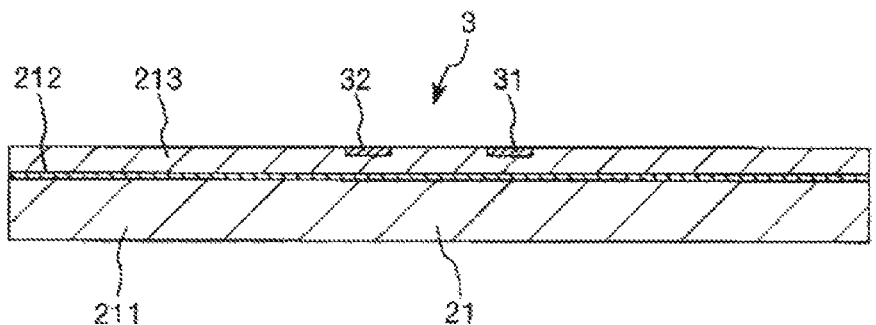
FIG. 8 is a sectional view for explaining the manufacturing method of the pressure sensor illustrated in FIG. 1.
Figure 9:
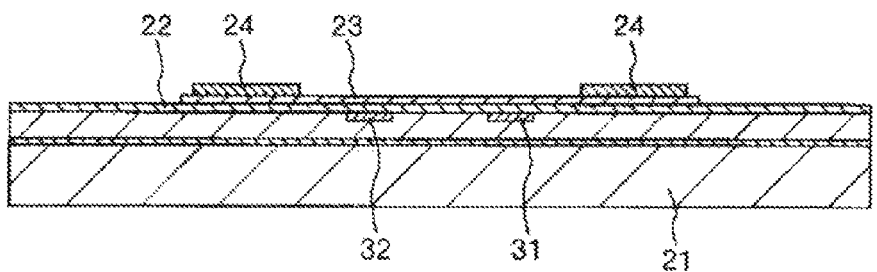
FIG. 9 is a sectional view for explaining the manufacturing method of the pressure sensor illustrated in FIG. 1.

First, as illustrated in FIG. 8, the semiconductor substrate 21 that is the SOI substrate is prepared and the pressure sensor portion 3 is formed by injecting impurities such as phosphorus and boron into the upper surface of the semiconductor substrate 21. Next, as illustrated in FIG. 9, the first insulating film 22, the second insulating film 23, and the polysilicon film 24 are formed on the semiconductor substrate 21 by using a sputtering method, a CVD method, or the like.

Figure 10:
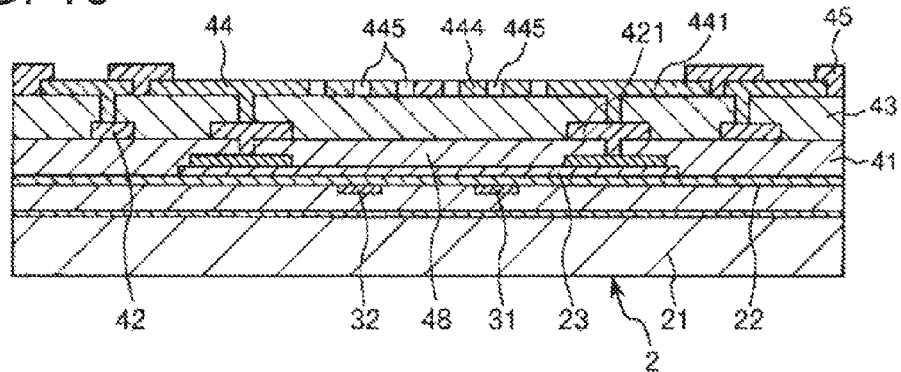
FIG. 10 is a sectional view for explaining the manufacturing method of the pressure sensor illustrated in FIG. 1.

Next, as illustrated in FIG. 10, the interlayer insulating film 41, the wiring layer 42, the interlayer insulating film 43, the wiring layer 44, and the surface protection film 45 are formed on the semiconductor substrate 21 in this order by using a sputtering method, a CVD method, or the like. Therefore, the sacrificial layer 48 that is surrounded by the substrate 2 and the wiring portions 421 and 441, and the covering layer 444 covering the sacrificial layer 48 from above are formed.

Unevenness Forming Step

Figure 11:
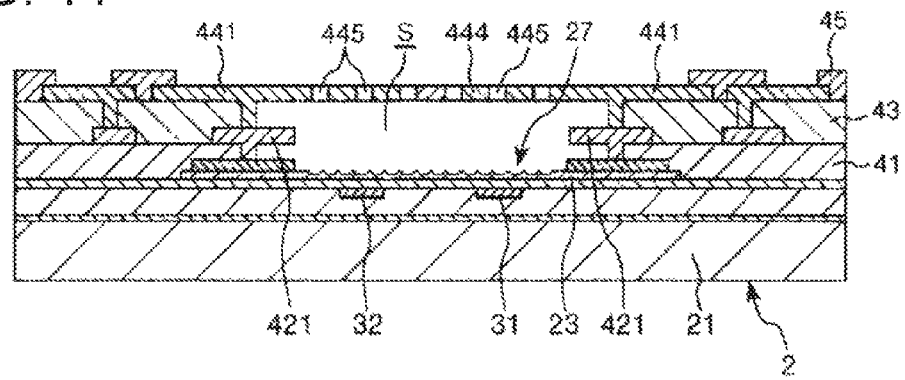
FIG. 11 is a sectional view for explaining the manufacturing method of the pressure sensor illustrated in FIG. 1.

Next, as illustrated in FIG. 11, the surface protection film 45 is protected by a resist mask (not illustrated) and the substrate 2 is exposed to, for example, an etching solution such as a buffered hydrofluoric acid. Therefore, the sacrificial layer 48 is released and etched via the through holes 445 and the cavity portion S is formed. In addition, the sacrificial layer 48 is removed, the upper surface of the substrate 2 facing the cavity portion S is etched by coming into contact with the etching solution, and the unevenness 27 is formed.

Figure 12:
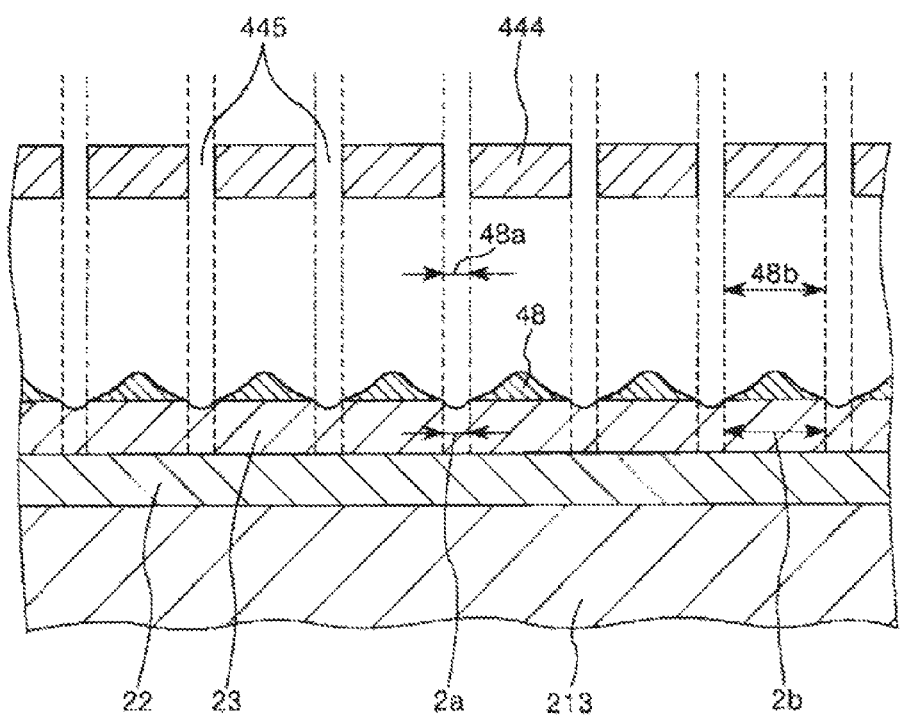
FIG. 12 is a sectional view for explaining the manufacturing method of the pressure sensor illustrated in FIG. 1.

When describing the formation of the unevenness 27 in detail, as illustrated in FIG. 12, according to wet etching (isotropic etching), portions 48a that are positioned directly under the through holes 445 of the sacrificial layer 48 are removed ahead of other portions 48b, and accordingly, portions 2a that are positioned directly under the through holes 445 of the upper surface of the substrate 2 are exposed to the etching solution for a longer period of time than other portions 2b. Therefore, the portions 2a are etched deeper than the portions 2b and thereby the plurality of recessed portions 271 corresponding to the disposition of the through holes 445 are formed, and the unevenness 27 is obtained (see FIG. 2). According to such a method, the unevenness 27 is easily formed. In addition, since it is possible to form the unevenness 27 together with the removal of the sacrificial layer 48, it is possible to reduce the manufacturing step of the pressure sensor 1. In addition, since it is possible to form the recessed portions 271 directly under the through holes 445, it is possible to simply control a shape (positions of the recessed portions 271) of the unevenness 27 by the disposition of the through holes 445.

Here, when the wet etching is completed and the etching solution within the cavity portion S is removed by drying or the like, sticking of the covering layer 444 to the substrate 2 easily occurs. This is because the sealing layer 46 is not laminated on the covering layer 444, the covering layer 444 is in a state of being relatively easy to be bent, the covering layer 444 is drawn to the substrate 2 side by the surface tension of the etching solution remaining in the cavity portion S, the etching solution is evaporated by drying, and almost at the same time, the covering layer 444 is attached to the substrate 2. Therefore, as in the embodiment, before the etching solution that is used for forming the cavity portion S is removed from the cavity portion S, it is possible to effectively reduce the occurrence of sticking in the step by forming the unevenness 27.

Sealing Step

Figure 13:
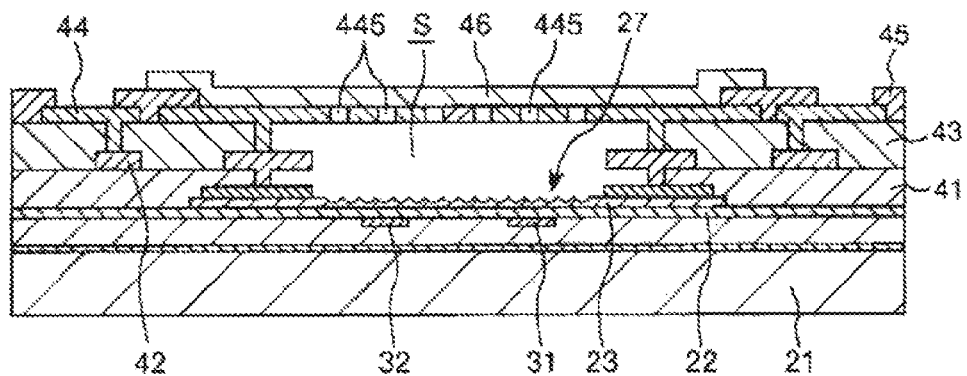
FIG. 13 is a sectional view for explaining the manufacturing method of the pressure sensor illustrated in FIG. 1.
Figure 14:
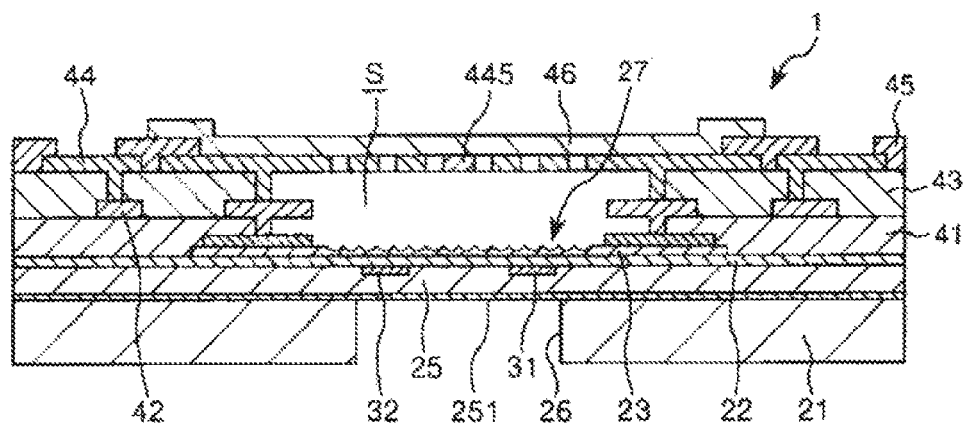
FIG. 14 is a sectional view for explaining the manufacturing method of the pressure sensor illustrated in FIG. 1.

Next, as illustrated in FIG. 13, the cavity portion S is in the vacuum state and the cavity portion S is sealed by the sealing layer 46. Next, as illustrated in FIG. 14, the recessed portion 26 is formed and the diaphragm 25 is formed by dry etching (silicon deep etching) on the lower surface of the semiconductor substrate 21. However, the recessed portion 26 may be formed by wet etching. Thus, the pressure sensor 1 is obtained.

Second Embodiment

Next, a pressure sensor of a second embodiment of the invention will be described.

Figure 15:
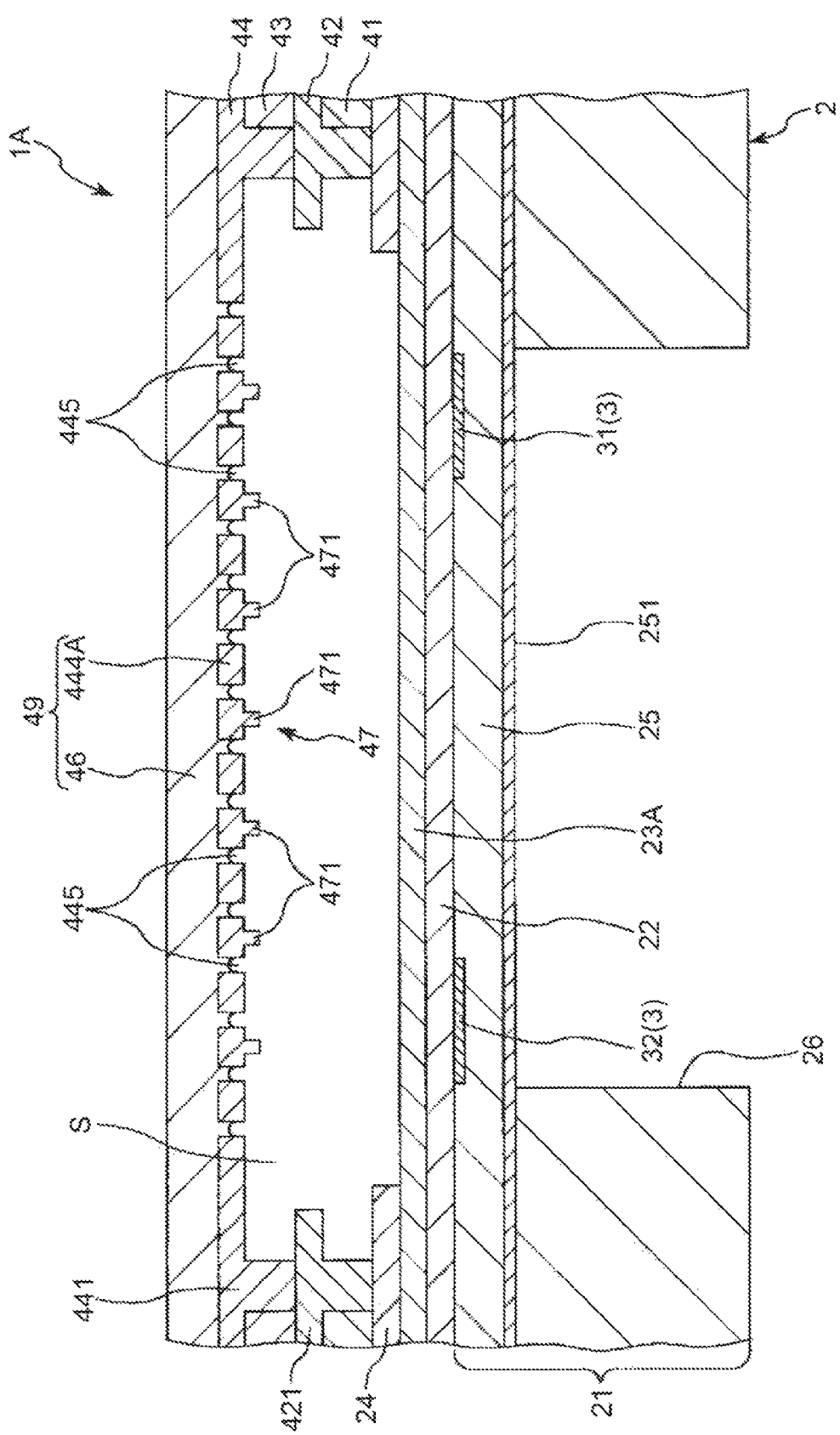
FIG. 15 is a partially enlarged sectional view of a pressure sensor according to a second embodiment of the invention.

FIG. 15 is a partially enlarged sectional view of the pressure sensor according to the second embodiment of the invention.

Hereinafter, the pressure sensor of the second embodiment will be described focusing on differences from the embodiment described above and the same reference numerals are given to the same matters and configurations, and description thereof will be omitted.

The pressure sensor according to the second embodiment of the invention is the same as that of the first embodiment described above except that the configuration of the unevenness is different.

As illustrated in FIG. 15, in a pressure sensor 1A of the embodiment, unevenness 47 is formed on a lower surface (surface facing a cavity portion S) of a covering layer 444A. In addition, the unevenness 47 has a plurality of protrusion portions 471 protruding downward from a lower surface of the covering layer 444A. Such protrusion portions 471 are integrally formed with the covering layer 444A.

Even with such a second embodiment, it is possible to achieve the same effects as those of the first embodiment described above.

Third Embodiment

Next, a pressure sensor of a third embodiment of the invention will be described.

Figure 16:
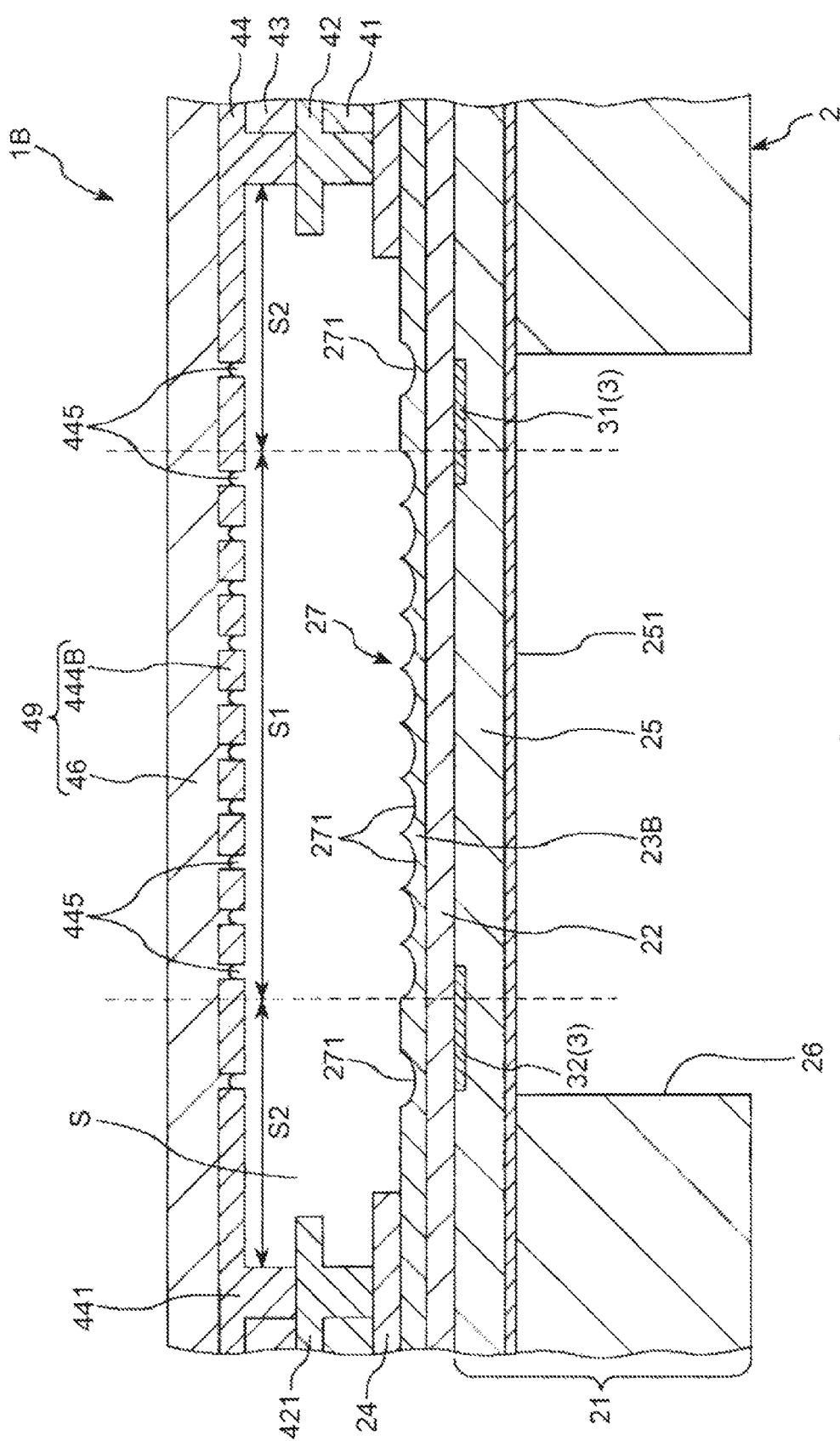
FIG. 16 is a partially enlarged sectional view of a pressure sensor according to a third embodiment of the invention.

FIG. 16 is a partially enlarged sectional view of the pressure sensor according to the third embodiment of the invention.

Hereinafter, the pressure sensor of the third embodiment will be described focusing on differences from the embodiment described above and the same reference numerals are given to the same matters and configurations, and description thereof will be omitted.

The pressure sensor according to the third embodiment of the invention is the same as that of the first embodiment described above except that the configuration of the unevenness is different.

As illustrated in FIG. 16, in a pressure sensor 1B of the embodiment, a surface of an upper surface of a substrate 2 facing a cavity portion S has a first region S1 in which unevenness 27 (recessed portions 271) is formed and second regions S2 in which the unevenness 27 (recessed portions 271) having a lower density than that of the first region S1 is formed. In other words, a covering layer 444B has the first region S1 in which through holes 445 are formed and the second regions S2 in which the through holes 445 having a lower density than that of the first region S1 are formed.

Therefore, the piezo-resistance elements 31 to 34 are disposed over a boundary portion between the first region S1 and the second regions S2. A formation density of the unevenness 27 of the first region S1 is higher than that of the second region S2 and accordingly a substantially thickness of the substrate 2 is thinned, and the first region S1 is easily deformed more than the second region S2. As described above, since a stress is easily concentrated in a boundary portion between the regions S1 and S2 in which ease of deformation is different when a diaphragm 25 is bent, a signal output from a bridge circuit 30 can be made larger by disposing the piezo-resistance elements 31 to 34 in the portion. Therefore, it is possible to further improve the detection accuracy of the pressure.

Moreover, the formation density of the recessed portions 271 of the second region S2 is not particularly limited, but, it is preferable that the formation density thereof is, for example, 10% or more and 70% or less of the formation density of the recessed portions 271 of the first region S1, and it is further preferable that the formation density thereof is 30% or more and 50% or less. Therefore, the stress is more easily concentrated in the boundary portion between the regions S1 and S2 when the diaphragm 25 is bent. Furthermore, since relatively more through holes 445 are disposed also on the second regions S2, it is possible to remove the sacrificial layer 48 by wet etching at a shorter period of time.

Even with such a third embodiment, it is possible to achieve the same effects as those of the first embodiment described above.

Fourth Embodiment

Next, a pressure sensor of a fourth embodiment of the invention will be described.

Figure 17:
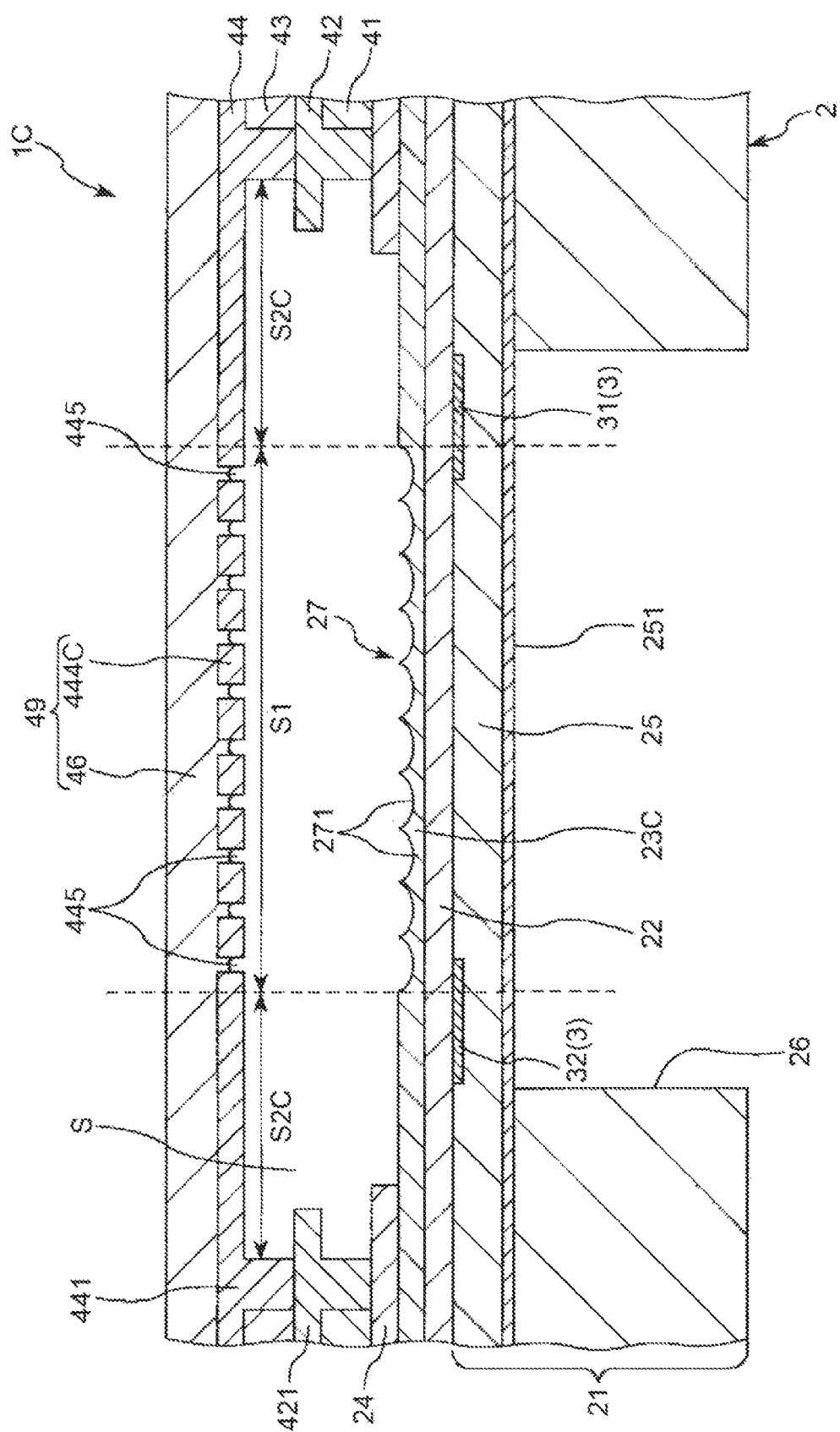
FIG. 17 is a partially enlarged sectional view of a pressure sensor according to a fourth embodiment of the invention.

FIG. 17 is a partially enlarged sectional view of the pressure sensor according to the fourth embodiment of the invention.

Hereinafter, the pressure sensor of the fourth embodiment will be described focusing on differences from the embodiment described above and the same reference numerals are given to the same matters and configurations and description thereof will be omitted.

The pressure sensor according to the fourth embodiment of the invention is the same as that of the first embodiment described above except that the configuration of the unevenness is different.

As illustrated in FIG. 17, in a pressure sensor 1C of the embodiment, a surface of an upper surface of a substrate 2 facing a cavity portion S has a first region S1 in which unevenness 27 (recessed portions 271) is formed and second regions S2C in which the unevenness 27 (recessed portions 271) is not formed. In other words, a covering layer 444C has the first region S1 in which through holes 445 are formed and the second regions S2C in which the through holes 445 are not formed.

Therefore, piezo-resistance elements 31 to 34 are disposed over a boundary portion between the first region S1 and the second regions S2C. As also in the third embodiment described above, since a stress is concentrated in a boundary portion between the first regions S1 and S2C, a signal output from a bridge circuit 30 can be made larger by disposing the piezo-resistance elements 31 to 34 in the portion. Therefore, it is possible to further improve the detection accuracy of the pressure.

Particularly, as described in the embodiment, it is preferable that the first region S1 is disposed at a center portion of a diaphragm 25 and the second regions S2C are disposed around thereof. As described above, since a ceiling portion 49 is most likely to come into contact with the substrate 2 at the center portion thereof, it is possible to effectively achieve the effects described above while effectively reducing sticking of the ceiling portion 49 by disposing the first region S1 at the center portion of the diaphragm 25.

Even with such a fourth embodiment, it is possible to achieve the same effects as those of the first embodiment described above.

Fifth Embodiment

Next, a pressure sensor of a fifth embodiment of the invention will be described.

Figure 18:
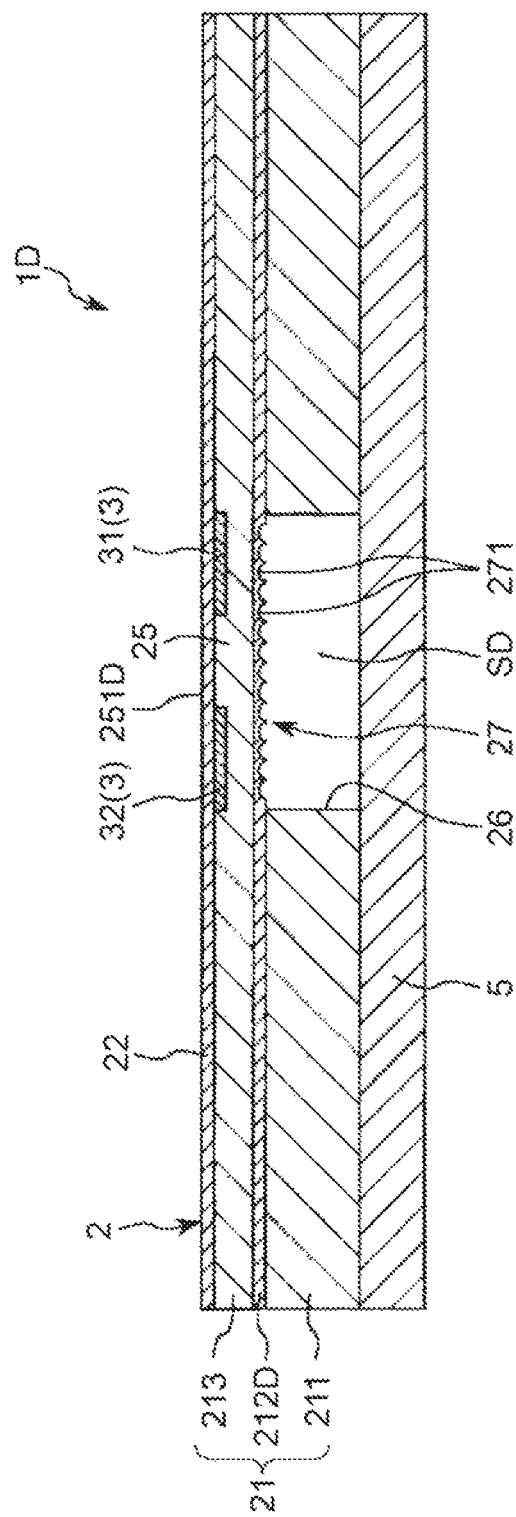
FIG. 18 is a sectional view of a pressure sensor according to a fifth embodiment of the invention.

FIG. 18 is a sectional view of the pressure sensor according to the fifth embodiment of the invention.

Hereinafter, the pressure sensor of the fifth embodiment will be described focusing on differences from the embodiment described above and the same reference numerals are given to the same matters and configurations and description thereof will be omitted.

As illustrated in FIG. 18, in a pressure sensor 1D of the embodiment, instead of omitting the surrounding structure 4 included in the embodiment described above, a plate-like lid portion 5 is bonded to a lower surface of a substrate 2 and a cavity portion (pressure reference chamber) SD is formed between the substrate 2 and the lid portion 5. In the pressure sensor 1D having such a configuration, a region of an upper surface of the substrate 2 overlapping the cavity portion SD is a pressure receiving surface 251D. Moreover, the lid portion 5 can be configured of, for example, a silicon substrate.

In such a pressure sensor 1D, unevenness 27 is formed on a lower surface (surface facing the cavity portion SD) of a diaphragm 25. Moreover, a silicon oxide layer 212D of a SOI substrate is remained on the lower surface of the diaphragm 25 and the unevenness 27 is formed on the silicon oxide layer 212D by etching or the like. In addition, such unevenness 27 has a plurality of recessed portions 271 that are opened to a lower surface of the silicon oxide layer 212D. As described above, it is possible to easily form the unevenness 27 and in addition, to reduce sticking (or sticking of the lid portion 5 to the diaphragm 25) of the diaphragm 25 to the lid portion 5 by disposing the unevenness 27 on the lower surface of the diaphragm 25. However, the disposition of the unevenness is not limited to the embodiment and the unevenness may be formed in a portion of an upper surface of the lid portion 5 facing the cavity portion SD.

Even with such a fifth embodiment, it is possible to achieve the same effects as those of the first embodiment described above.

Sixth Embodiment

Next, a pressure sensor of a sixth embodiment of the invention will be described.

Figure 19:
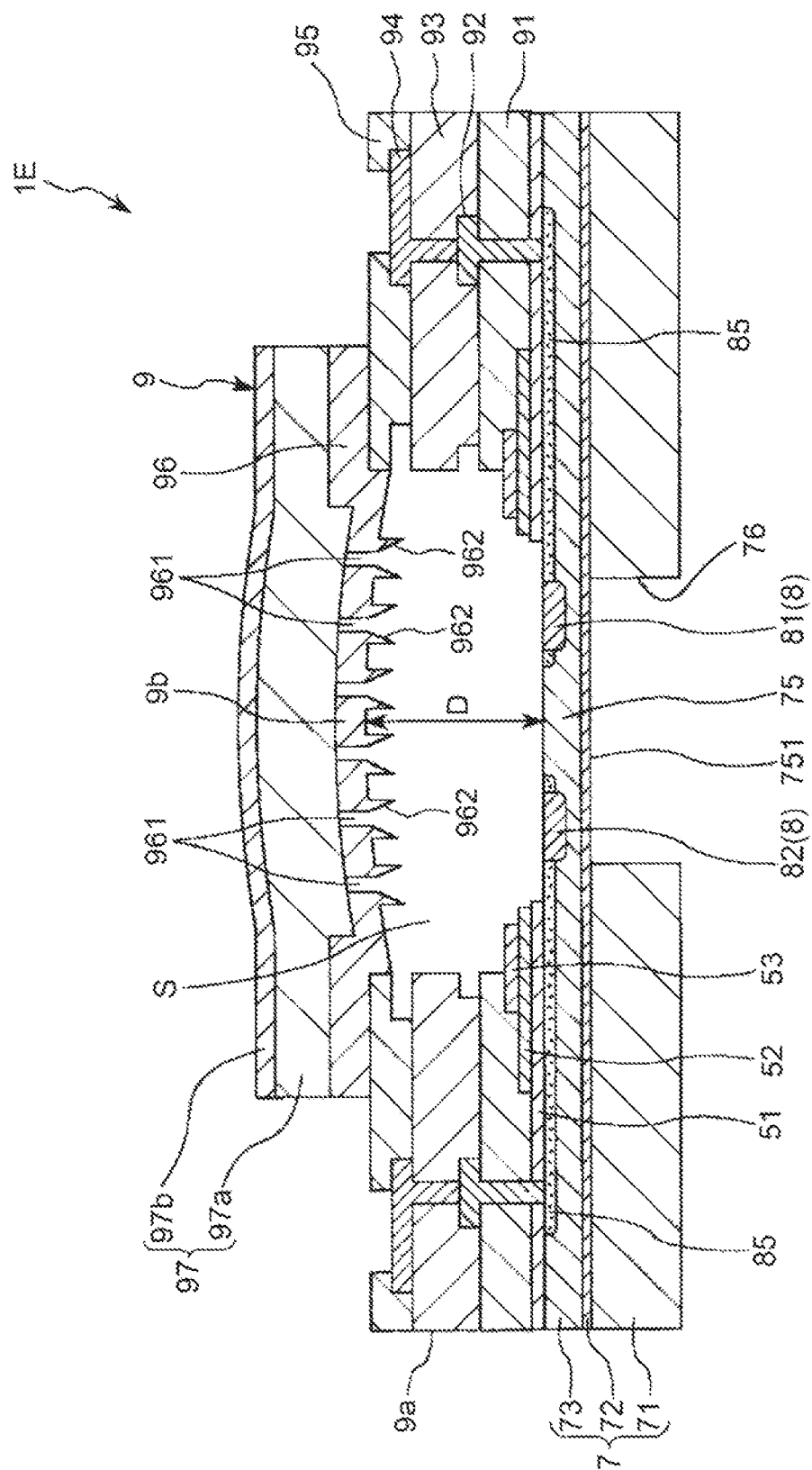
FIG. 19 is a sectional view of a pressure sensor according to a sixth embodiment of the invention.
Figure 20:
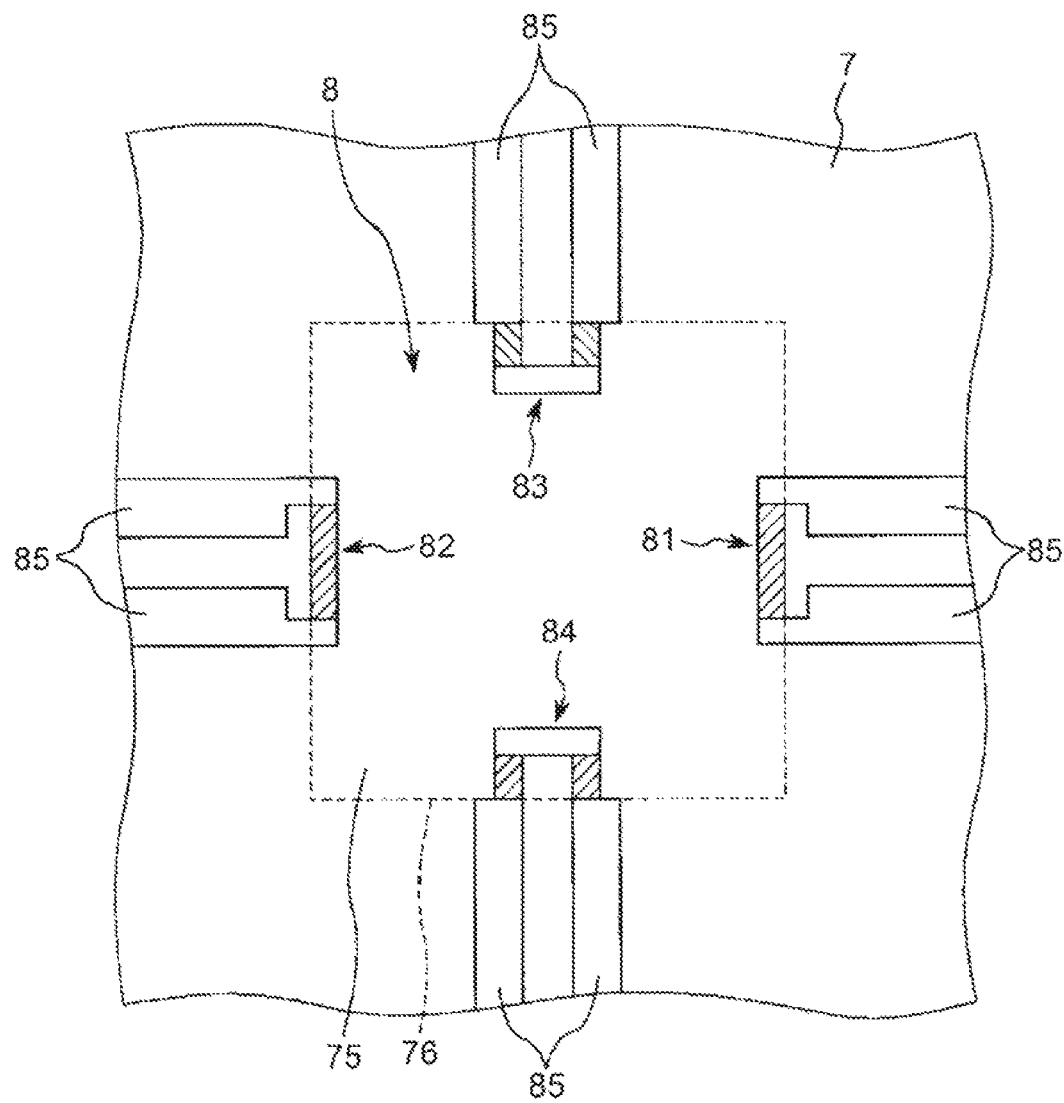
FIG. 20 is a plan view illustrating a pressure sensor portion included in the pressure sensor illustrated in FIG. 19.
Figure 21:
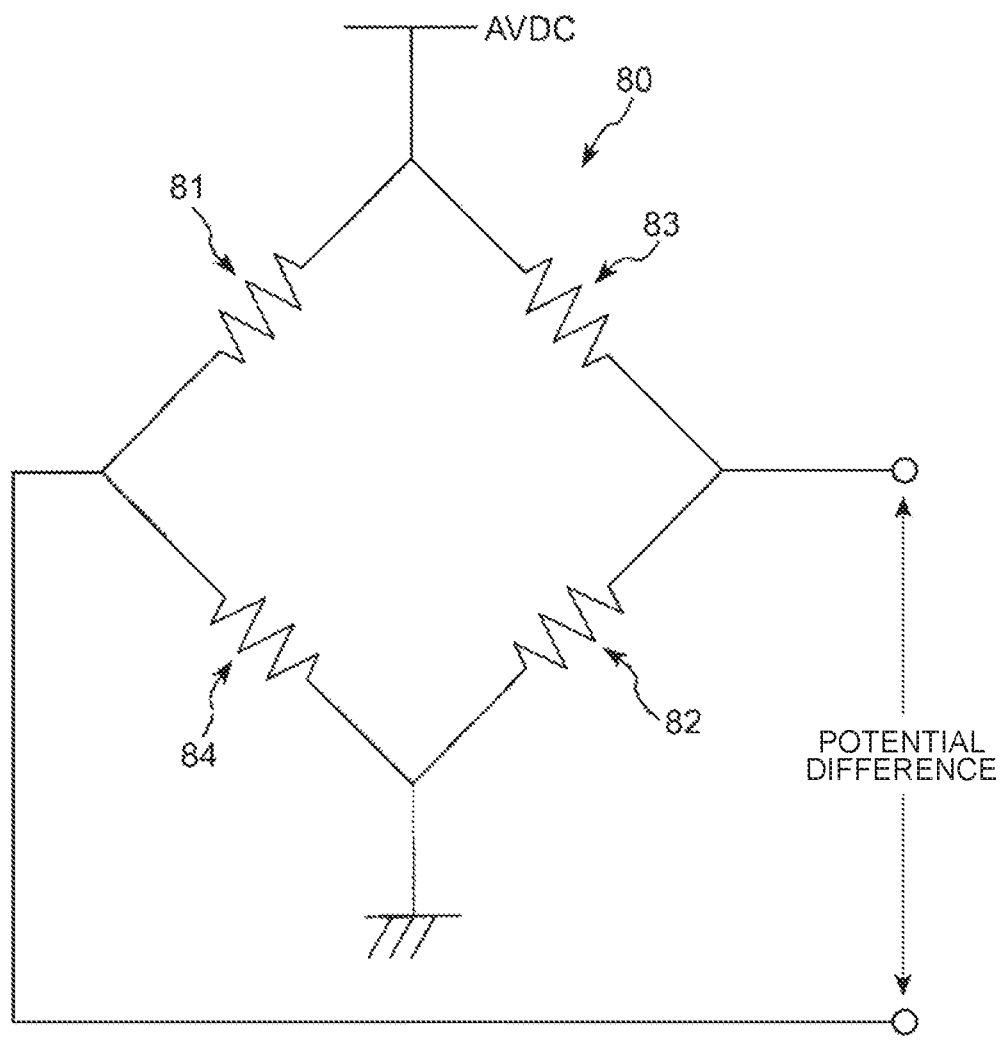
FIG. 21 is a diagram illustrating a bridge circuit including the pressure sensor portion illustrated in FIG. 20.
Figure 22:
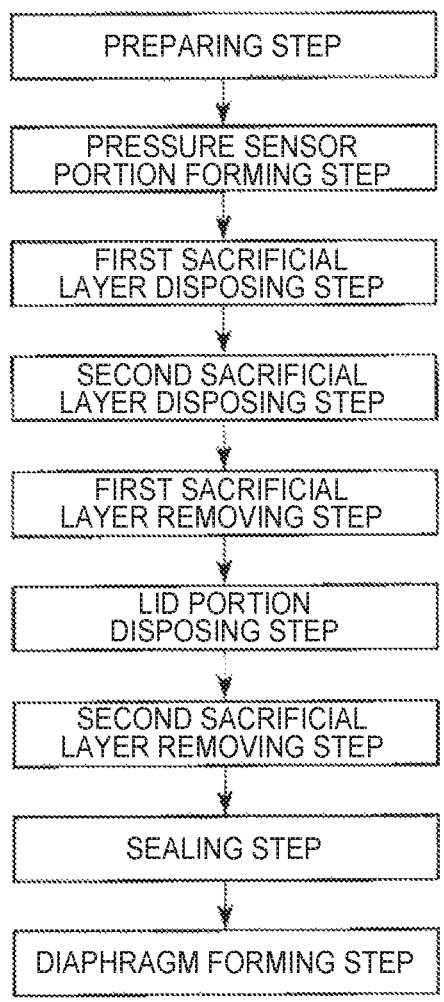
FIG. 22 is a flowchart illustrating a manufacturing method of the pressure sensor illustrated in FIG. 19.

FIG. 19 is a sectional view of the pressure sensor according to the sixth embodiment of the invention. FIG. 20 is a plan view illustrating a pressure sensor portion included in the pressure sensor illustrated in FIG. 19. FIG. 21 is a diagram illustrating a bridge circuit including the pressure sensor portion illustrated in FIG. 20. FIG. 22 is a flowchart illustrating a manufacturing method of the pressure sensor illustrated in FIG. 19. FIGS. 23 to 32 are sectional views for explaining the manufacturing method of the pressure sensor illustrated in FIG. 19. Moreover, in the following description, an upper side is also referred to as "upper" and a lower side is also referred to as "lower" in FIG. 19. In addition, a plan view of a substrate, that is, a plan view that is seen from a vertical direction in FIG. 19 is also simply referred to as a "plan view".

A pressure sensor 1E illustrated in FIG. 19 has a substrate 7 having a diaphragm 75 that is flexibly deformed by receiving a pressure, a cavity portion S as a pressure reference chamber that is disposed on an upper surface (one surface) side of the diaphragm 75, a surrounding structure 9 that forms the cavity portion S together with the substrate 7, and a pressure sensor portion 8 that includes piezo-resistance elements 81, 82, 83, and 84 that are disposed on an upper surface of the diaphragm 75. In addition, the surrounding structure 9 has a frame-like side wall portion 9a that is disposed so as to surround the cavity portion S in a plan view, and a lid portion 9b that is disposed so as to sandwich the cavity portion S between the substrate 7 and the lid portion 9b. The lid portion 9b has a portion that is curved so as to be protruded to a side opposite to the cavity portion S.

Specifically, a portion (portion of the lid portion 9b facing the cavity portion S) of the lid portion 9b facing the diaphragm 75 via the cavity portion S is curved so as to protrude on a side opposite to the cavity portion S. According to such a pressure sensor 1E, even at the same height of the side wall portion 9a, as the lid portion 9b is curved, a spacing distance D between the lid portion 9b and the diaphragm 75 can be secured to be large. Therefore, it is possible to reduce probability of contact between the lid portion 9b and the diaphragm 75. In addition, the lid portion 9b has a shape that is curved so as to be protruded to a side opposite to the cavity portion S. Therefore, a strength is increased more than that of a flat shape and deformation due to a pressing force toward the cavity portion S side is reduced. Therefore, the pressure sensor 1E is excellent in the detection accuracy of the pressure and has a high reliability. Hereinafter, each portion of the pressure sensor 1E will be described in detail in this order.

Substrate

As illustrated in FIG. 19, the substrate 7 is configured of a SOI substrate having a first silicon layer 71, a second silicon layer 73 that is disposed on an upper side of the first silicon layer 71, and a silicon oxide layer 72 that is disposed between the first silicon layer 71 and the second silicon layer 73. However, the substrate 7 is not limited to the SOI substrate and, for example, a silicon substrate having a single layer can be used.

In addition, the substrate 7 is provided with a diaphragm 75 that is thinner than the surrounding portion and is flexibly deformed by receiving a pressure. The diaphragm 75 is formed as a bottom portion of a recessed portion 76 by providing the recessed portion 76 having a bottom that is opened toward a lower surface thereof. Therefore, the lower surface of the diaphragm 75 is a pressure receiving surface 751. A thickness of such a diaphragm 75 is not particularly limited, but is preferably 1.5 μm or more and 2.0 μm or less. Therefore, the diaphragm 75 becomes thin and is easily deflected while maintaining a sufficient mechanical strength.

Here, in the embodiment, the diaphragm 75 is configured of a laminated body of the silicon oxide layer 72 and the second silicon layer 73, but the configuration of the diaphragm is not particularly limited, and, for example, the diaphragm 75 can be a diaphragm of a single layer structure only configured of the second silicon layer 73.

The substrate 7 is described above. In addition, a semiconductor circuit that is electrically connected to a pressure sensor portion 8 may be built on an upper surface of such a substrate 7.

A first insulating film 51 that is configured of a silicon oxide film ($SiO_2$ film), a second insulating film 52 that is configured of a silicon nitride film (SiN film), and a third insulating film 53 that is configured of polysilicon are laminated on the upper surface of such a substrate 7 in this order. The three insulating films 51, 52, and 53 do not cover the upper surface of the diaphragm 75 and are disposed in a frame-like so as to surround an outer edge of the diaphragm 75. However, for example, the first and second insulating films 51 and 52 may be disposed so as to cover the upper surface of the diaphragm 25. In addition, the three insulating films 51, 52, and 53 may be provided if necessary and, for example, at least one insulating film may be omitted. In addition, a configuration material of each of the three insulating films 51, 52, and 53 is also not particularly limited.

Pressure Sensor Portion

As illustrated in FIG. 20, the pressure sensor portion 8 has four piezo-resistance elements 81, 82, 83, and 84 that are disposed on the upper surface of the diaphragm 75. Therefore, the piezo-resistance elements 81, 82, 83, and 84 are electrically connected to each other via wirings 85 and the like, and configure a bridge circuit 80 (Wheatstone bridge circuit) illustrated in FIG. 21.

A drive circuit (not illustrated) for supplying a drive voltage AVDC is connected to the bridge circuit 80. Therefore, the bridge circuit 80 outputs a signal (voltage) depending on a change in resistance values of the piezo-resistance elements 81, 82, 83, and 84 based on deflection of the diaphragm 75. Therefore, it is possible to detect a pressure received by the diaphragm 75 based on the output signal.

The piezo-resistance elements 81, 82, 83, and 84 are respectively configured, for example, by doping (diffusing or injecting) impurity such as phosphorus or boron into the second silicon layer 73. In addition, the wiring 85 is configured, for example, by doping (diffusing or injecting) impurities such as phosphorus and boron into the second silicon layer 73 with a higher concentration than that of the piezo-resistance elements 81, 82, 83, and 84.

Cavity Portion

As illustrated in FIG. 19, the cavity portion S is positioned above the diaphragm 75 and is formed by being surrounded by the substrate 7 and the surrounding structure 9. Such a cavity portion S is hermetically sealed space and functions as a pressure reference chamber that is a reference value of a pressure that is detected by the pressure sensor 1E. It is preferable that the cavity portion S is in a vacuum state (for example, 10 Pa or less). Therefore, the pressure sensor 1E can be used as a so-called "absolute pressure sensor" that detects a pressure on the basis of vacuum and has high convenience. However, the cavity portion S may not be in the vacuum state as long as the cavity portion S is kept at a constant pressure.

Surrounding Structure

As illustrated in FIG. 19, the surrounding structure 9 has a frame-like side wall portion 9a that is disposed so as to surround the cavity portion S on an upper surface side of the substrate 7 in a plan view of the substrate 7 and a lid portion 9b that is disposed so as to cover an opening of the side wall portion 9a. Such a surrounding structure 9 has an interlayer insulating film 91 that is disposed on the substrate 7, a wiring layer 92 that is disposed on the interlayer insulating film 91, an interlayer insulating film 93 that is disposed on the wiring layer 92 and the interlayer insulating film 91, a wiring layer 94 that is disposed on the interlayer insulating film 93, a surface protection film 95 that is disposed on the wiring layer 94 and the interlayer insulating film 93, a covering layer 96 that is disposed on the surface protection film 95, and a sealing layer 97 that is disposed on the covering layer 96. Therefore, mainly, the side wall portion 9a is configured of the interlayer insulating films 91 and 93, and the lid portion 9b is configured of the covering layer 96.

The interlayer insulating films 91 and 93 are disposed in a frame-like so as to surround a periphery of the cavity portion S in a plan view and, as described above, configure the side wall portion 9a. As the interlayer insulating films 91 and 93, for example, an insulating film such as a silicon oxide film ($SiO_2$ film) can be used.

The wiring layers 92 and 94 are disposed to penetrate the interlayer insulating films 91 and 93, and are electrically connected to the wiring 85 of the pressure sensor portion 8. Therefore, the wiring 85 is drawn out to the upper surface of the surrounding structure 9 via the wiring layers 92 and 94. As the wiring layers 92 and 94, for example, a metal film such as an aluminum film can be used.

The covering layer 96 is disposed so as to cover the opening of the upper side of the side wall portion 9a. Therefore, a portion of the covering layer 96, in which the cavity portion S is interposed between the substrate 7 and the portion of the covering layer 96, in other words, a ceiling portion of the cavity portion S is the lid portion 9b. Such a lid portion 9b (the covering layer 96) has a plurality of through holes 961 (lid portion through holes) communicating between an inside and an outside of the cavity portion S. The through holes 961 are, as described below in the manufacturing method, holes for release etching for removing a sacrificial layer with which the cavity portion S is filled.

In addition, the lid portion 9b (the covering layer 96) has a plurality of protrusion portions 962 protruding from the lower surface thereof to the diaphragm 75 side. The protrusion portions 962 are integrally formed with the lid portion 9b. In addition, each of the protrusion portions 962 is annular (cylindrical) and one protrusion portion 962 is disposed so as to surround a periphery of the opening on a lower side of one through hole 961. In other words, the annular protrusion portion 962 is protruded from an end surface of the opening on the lower side of each through hole 961. Such protrusion portions 962 are provided and thereby, for example, even if the lid portion 9b is bent downward and comes into contact with the diaphragm 75, the contact is contact between the protrusion portions 962 and the diaphragm 75. Therefore, it is possible to reduce a contact area during contact. Thus, it is possible to effectively reduce sticking. Moreover, as described below in the manufacturing method, the formation of the protrusion portions 962 is easily performed by configuring the protrusion portions 962 as in the embodiment.

In addition, the lid portion 9b is generally curved so as to protrude upward (side opposed to the cavity portion S). As described above, even at the same height of the side wall portion 9a, as the lid portion 9b is curved upward, a spacing distance D between the lid portion 9b and the diaphragm 75 can be secured to be large by causing the lid portion 9b to be curved upward. Therefore, it is possible to reduce the contact between the lid portion 9b and the diaphragm 75 without increasing the size of the pressure sensor 1E. Therefore, the pressure sensor 1E is excellent in the detection accuracy of the pressure and has a high reliability.

Such a lid portion 9b is configured to include silicon and, particularly, is configured of silicon in the embodiment. As described above, the lid portion 9b is composed of silicon and thereby, as described below in the manufacturing method, the lid portion 9b can be easily formed by a semiconductor process.

The lid portion 9b (covering layer 96) is described above. The sealing layer 97 is disposed on the upper side (side opposed to the cavity portion S) of the lid portion 9b and the through holes 961 are sealed by the sealing layer 97. Such a sealing layer 97 is disposed and thereby the through holes 961 can be relatively simply sealed.

In addition, the sealing layer 97 has a first sealing layer 97a that is disposed on the upper surface of the covering layer 96 and a second sealing layer 97b that is disposed on the upper surface of the first sealing layer 97a. As described above, the sealing layer 97 has a laminated structure and thereby the through holes 961 can be further reliably sealed. In addition, the first sealing layer 97a and the second sealing layer 97b are respectively configured to include silicon and, particularly, in the embodiment, the first sealing layer 97a is configured of silicon and the second sealing layer 97b is configured of silicon oxide. As described above, the first sealing layer 97a and the second sealing layer 97b are configured of silicon and thereby as described also below in the manufacturing method, the first sealing layer 97a and the second sealing layer 97b can be easily formed by the semiconductor process.

However, the configuration of the sealing layer 97 is not particularly limited and, for example, the second sealing layer 97b may be omitted. In addition, a configuration material of the second sealing layer 97b is not limited to a silicon based material and, for example, various metal materials such as Al, Cu, W, Ti, and TiN can be used.

The surface protection film 95 has a function of protecting the surrounding structure 9 from moisture, dust, scratches, and the like. Such a surface protection film 95 is not particularly limited and, for example, a silicon oxide film, a silicon nitride film, a polyimide film, an epoxy resin film, and the like can be used, but in the embodiment, the silicon nitride film is used.

The configuration of the pressure sensor 1E is described above in detail. In such a pressure sensor 1E, as described above, the side wall portion 9a, the lid portion 9b, and the sealing layer 97 of the surrounding structure 9 which are disposed in the periphery of the cavity portion S are respectively configured of the silicon-based material. Therefore, it is possible to effectively reduce a temperature hysteresis (phenomenon in which a measured value varies depending on an environment temperature even under the same pressure) and to achieve high detection accuracy of the pressure.

Specifically, if the surrounding structure 9 is configured as in the embodiment, it is possible to reduce a difference in the thermal expansion coefficient between the substrate 7 and the surrounding structure 9. Therefore, regardless of the environment temperature, an internal stress of the diaphragm 75 hardly changes. Therefore, regardless of the environment temperature, a signal having a predetermined size with respect to a predetermined pressure is obtained from the pressure sensor portion 8 and it is possible to effectively reduce the temperature hysteresis described above.

Next, the manufacturing method of the pressure sensor 1E will be described. As illustrated in FIG. 22, the manufacturing method of the pressure sensor 1E includes a preparing step for preparing the substrate 7 having a diaphragm forming region 750; a pressure sensor portion forming step for forming the pressure sensor portion in the substrate 7; a first sacrificial layer disposing step for disposing the first sacrificial layer 61 on one surface side of the substrate 7 so as to overlap the diaphragm forming region 750 in a plan view; a second sacrificial layer disposing step for disposing the second sacrificial layer 62 having through holes 621 facing the first sacrificial layer 61 on a surface side of the first sacrificial layer 61 opposite to the substrate 7; a first sacrificial layer removing step for removing the first sacrificial layer 61 via the through holes 621; a lid portion disposing step for causing the lid portion 9b to be curved to a surface side of the second sacrificial layer 62 opposite to the substrate 7 so as to protrude on a side opposite to the substrate 7 and for disposing the lid portion 9b having the through holes 961 (lid portion through holes) communicating with the through holes 621; a second sacrificial layer removing step for removing the second sacrificial layer 62 via the through holes 961; a sealing step for disposing the sealing layer 97 that seals the through holes 961 on a surface side of the lid portion 9b opposite to the substrate 7; and a diaphragm forming step for forming the diaphragm 75 that is flexibly deformed by receiving a pressure on the diaphragm forming region 750 of the substrate 7.

Preparing Step

Figure 23:
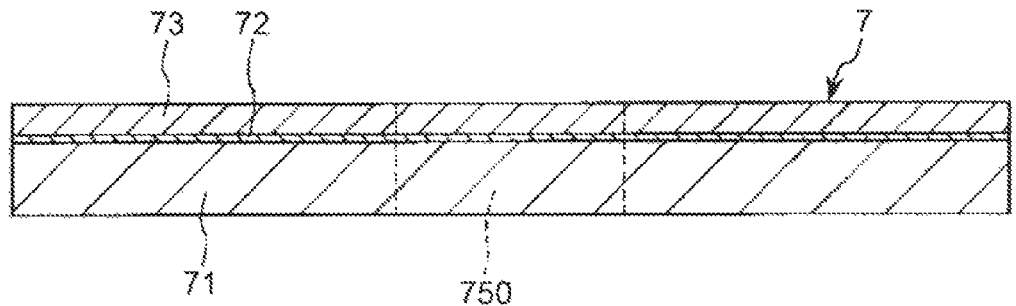
FIG. 23 is a sectional view for explaining the manufacturing method of the pressure sensor illustrated in FIG. 19.

First, as illustrated in FIG. 23, the substrate 7 that is formed of the SOI substrate configured by laminating the first silicon layer 71, the silicon oxide layer 72, and the second silicon layer 73 is prepared. Moreover, in this step, the diaphragm 75 is not formed in the diaphragm forming region 750 of the substrate 7.

Pressure Sensor Portion Forming Step

Figure 24:
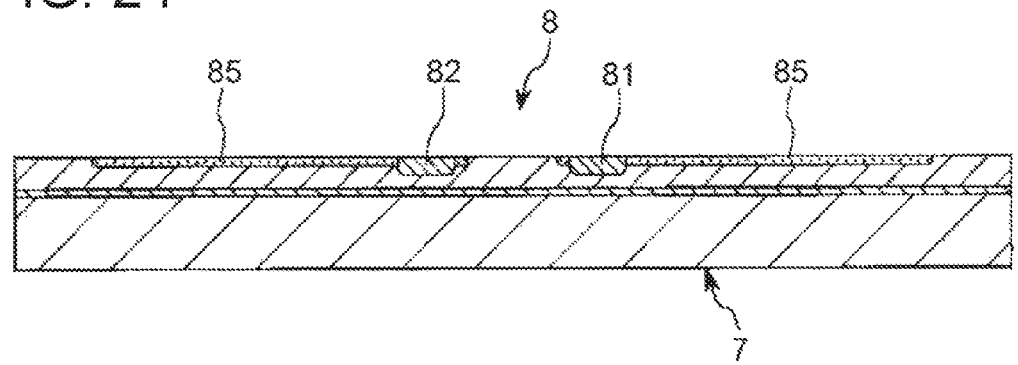
FIG. 24 is a sectional view for explaining the manufacturing method of the pressure sensor illustrated in FIG. 19.
Figure 25:
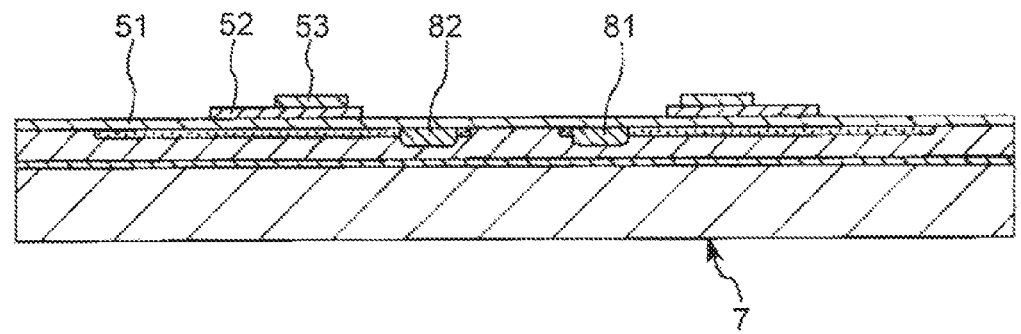
FIG. 25 is a sectional view for explaining the manufacturing method of the pressure sensor illustrated in FIG. 19.

Next, as illustrated in FIG. 24, the pressure sensor portion 8 is formed by injecting impurities such as phosphorus and boron on the upper surface of the substrate 7. Then, as illustrated in FIG. 25, the first insulating film 51, the second insulating film 52, and the third insulating film 53 are formed on the substrate 7 in this order by using a sputtering method, a CVD method, or the like. Moreover, in this step, the first insulating film 51 can be disposed also on the diaphragm forming region 750 (see FIG. 23).

Figure 26:
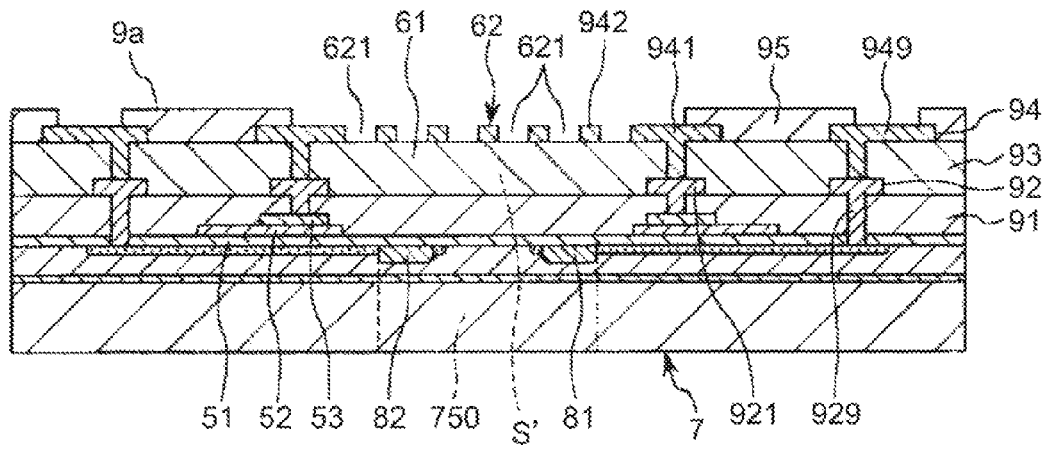
FIG. 26 is a sectional view for explaining the manufacturing method of the pressure sensor illustrated in FIG. 19.

First Sacrificial Layer Disposing Step and Second Sacrificial Layer Disposing Step Next, as illustrated in FIG. 26, the interlayer insulating film 91, the wiring layer 92, the interlayer insulating film 93, the wiring layer 94, and the surface protection film 95 are formed on the substrate 7 in this order by using a sputtering method, a CVD method, or the like. Moreover, in the embodiment, the interlayer insulating films 91 and 93 are configured of silicon oxide and the wiring layers 92 and 94 are configured of aluminum.

The side wall portion 9a is obtained and is disposed so as to overlap the diaphragm forming region 750 in a plan view, and the first sacrificial layer 61 and the second sacrificial layer 62 positioned within a cavity portion forming region S' which later becomes the cavity portion S are obtained by this step. The first sacrificial layer 61 is formed of the interlayer insulating films 91 and 93 and the second sacrificial layer 62 is formed of the wiring layers 92 and 94.

Here, the second sacrificial layer 62 is disposed along an outline of the cavity portion forming region S' and surrounds the first sacrificial layer 61. Therefore, the wiring layer 92 has a frame-like wiring portion 921 that is disposed along the outline of the cavity portion forming region S' in a plan view and a wiring portion 929 that is electrically connected to the wiring 85 (see FIG. 24). On the other hand, the wiring layer 94 has a frame-like wiring portion 941 that is disposed along the outline of the cavity portion forming region S' in a plan view and is connected to the wiring portion 921, a ceiling portion 942 that is disposed so as to cover the upper surface of the first sacrificial layer 61 and is integrally formed with the wiring portion 941, and a wiring portion 949 that is electrically connected to the wiring 85. The second sacrificial layer 62 is configured of the wiring portions 921 and 941, and the ceiling portion 942.

In addition, the through holes 621 facing the first sacrificial layer 61 are formed in the ceiling portion 942. A thickness of the ceiling portion 942 is not particularly limited, but, for example, is preferably 0.5 μm or more and 2.0 μm or less. In addition, a diameter of the through hole 621 is not particularly limited, but, for example, can be 1.0 μm or more and 2.0 μm or less.

First Sacrificial Layer Removing Step

Figure 27:
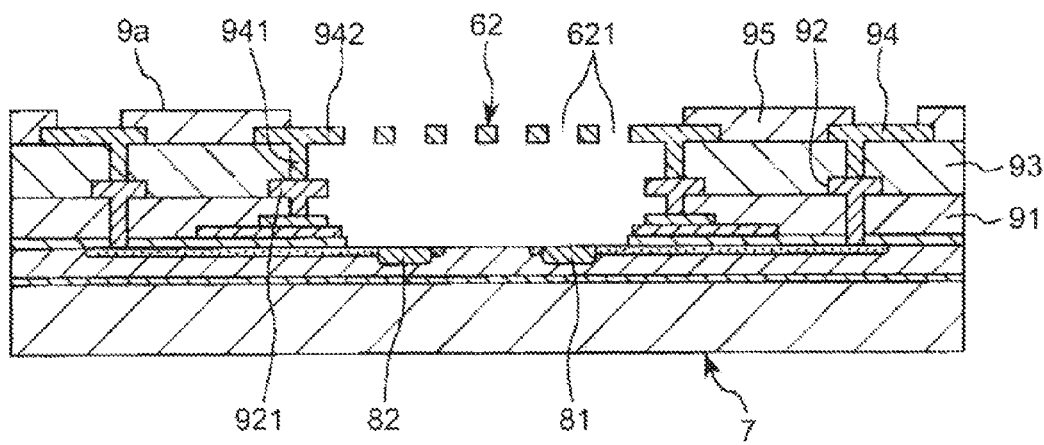
FIG. 27 is a sectional view for explaining the manufacturing method of the pressure sensor illustrated in FIG. 19.

Next, the substrate 7 is exposed to, for example, an etching solution such as buffered hydrofluoric acid. Therefore, as illustrated in FIG. 27, the first sacrificial layer 61 is removed via the through holes 621. In this case, the second sacrificial layer 62 configured of aluminum functions as an etching stopper.

Lid Portion Disposing Step

Figure 28:
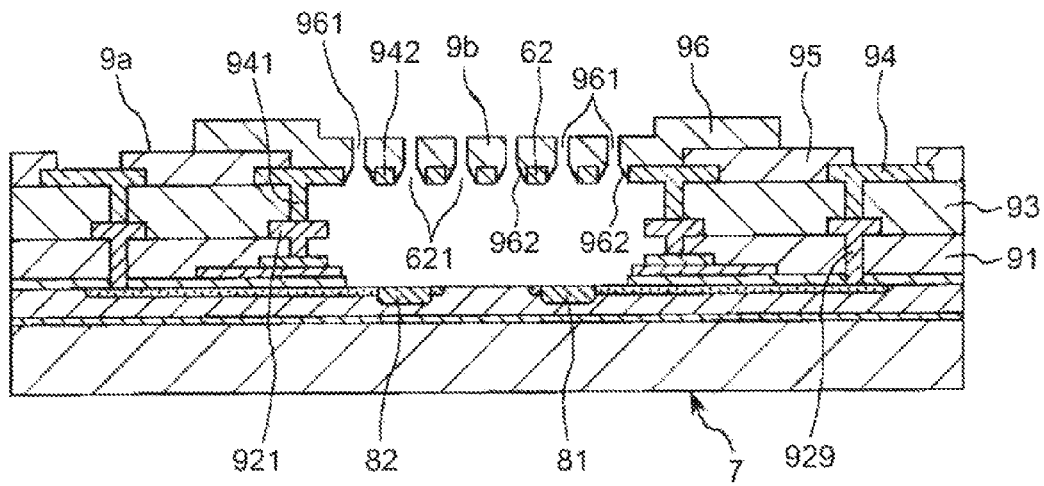
FIG. 28 is a sectional view for explaining the manufacturing method of the pressure sensor illustrated in FIG. 19.

Next, as illustrated in FIG. 28, the covering layer 96 is formed on the upper surface of the second sacrificial layer 62 (ceiling portion 942) by using a sputtering method, a CVD method, or the like. Moreover, in the embodiment, the covering layer 96 is configured of silicon. Here, in this step, the covering layer 96 is formed so as to enter an inner peripheral surface of the through hole 621 and the protrusion portion 962 is formed by this portion. In addition, the covering layer 96 is formed so as not to completely block the through holes 621 and thereby the covering layer 96 having the through holes 961 communicating with the through holes 621 is obtained.

Here, as described above, the diameter of the through hole 621 is 1.0 μm or more and 2.0 μm or less, and thereby the covering layer 96 easily enters the through holes 621 and an entered portion can be relatively thick. Therefore, it is possible to further reliably form the protrusion portion 962 and to improve the mechanical strength thereof. Furthermore, since it is difficult for blocking the through holes 621 by the covering layer 96, it is possible to further reliably form the through holes 961 in the covering layer 96. In addition, as described above, the thickness of the ceiling portion 942 is 0.5 μm or more and 2.0 μm or less, and thereby the protrusion portion 962 can be sufficiently protruded.

The thickness of the covering layer 96 is not particularly limited, but is preferably 0.3 μm or more and 2.0 μm or less. Therefore, it is possible to prevent excessive thickening of the covering layer 96 while maintaining a sufficient mechanical strength in the covering layer 96. In addition, if the covering layer 96 is excessively thickened, since there is a concern that the through holes 961 are blocked, the above-mentioned thickness is preferable for forming the through holes 961 that are not blocked.

Moreover, the through holes 961 may not be formed in the covering layer 96 depending on a film forming device, film forming conditions, and the diameter of the through hole 621, but, in this case, the through holes 961 may be formed by using, for example, an etching method after the covering layer 96 is formed.

Figure 29:
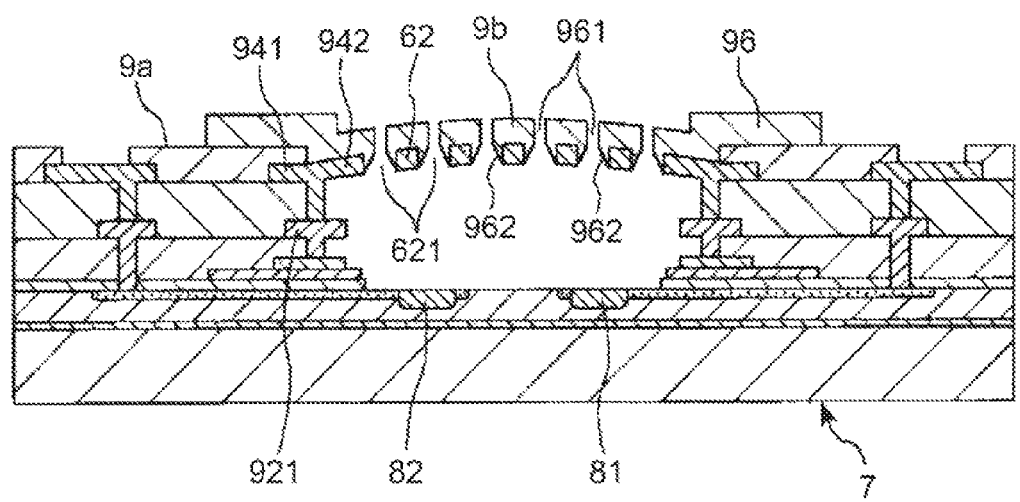
FIG. 29 is a sectional view for explaining the manufacturing method of the pressure sensor illustrated in FIG. 19.

Next, the ceiling portion 942 and the covering layer 96 are thermally expanded by heating. Here, the thermal expansion coefficient of aluminum configuring the ceiling portion 942 (second sacrificial layer 62) is 23 ppm/K and the thermal expansion coefficient of silicon configuring the covering layer 96 is 2.6 ppm/K. That is, the thermal expansion coefficient of the covering layer 96 is smaller than the thermal expansion coefficient of the ceiling portion 942 (second sacrificial layer 62). Therefore, the ceiling portion 942 and the covering layer 96 are curved and deformed so as to protrude on the upper side by thermal expansion due to a difference in the thermal expansion coefficient between these materials. Therefore, as illustrated in FIG. 29, the lid portion 9b that is curved so as to protrude on the upper side is obtained. Moreover, such a deformed state is maintained even when the temperature is lowered.

Here, it is preferable that the lid portion 9b (covering layer 96) having tensile stress is formed by devising film forming conditions of the sputtering method and the CVD method. As described above, the lid portion 9b has the tensile stress and thereby the ceiling portion 942 and the covering layer 96 are curved and deformed so as to protrude on the upper side by a synergistic effect with thermal expansion during heating.

Second Sacrificial Layer Removing Step

Figure 30:
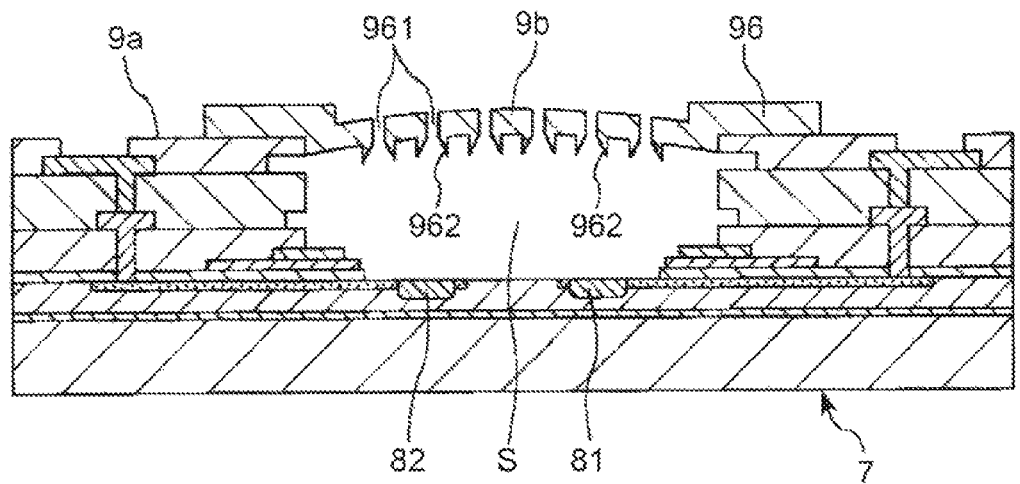
FIG. 30 is a sectional view for explaining the manufacturing method of the pressure sensor illustrated in FIG. 19.

Next, the substrate 7 is exposed to, for example, the etching solution of mixed acid such as phosphoric acid, acetic acid, and nitric acid, and the like. Therefore, the second sacrificial layer 62 (that is, the wiring portions 921 and 941, and the ceiling portion 942) is removed via the through holes 961. Therefore, as illustrated in FIG. 30, the cavity portion S is formed. Moreover, even if the second sacrificial layer 62 is removed, the curved shape of the lid portion 9b is maintained.

Sealing Step

Figure 31:
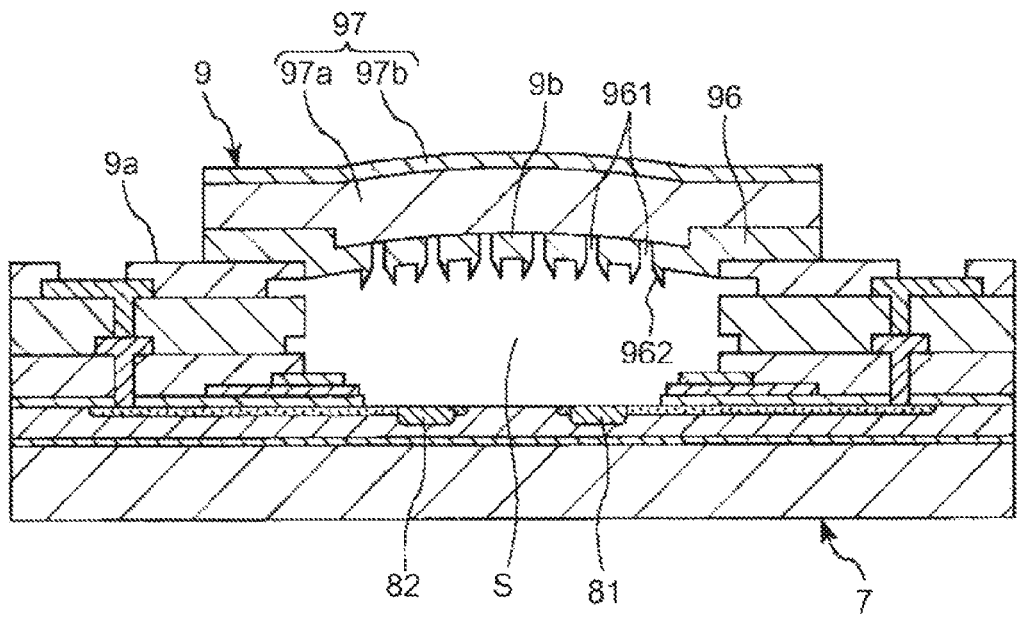
FIG. 31 is a sectional view for explaining the manufacturing method of the pressure sensor illustrated in FIG. 19.

Next, as illustrated in FIG. 31, the cavity portion S is in a vacuum state, the first sealing layer 97a and the second sealing layer 97b are formed on the covering layer 96 by using a sputtering method, a CVD method, or the like, the sealing layer 97 is formed, and the through holes 961 are sealed. Therefore, the cavity portion S that is sealed in the vacuum state is obtained.

Moreover, the thickness of the first sealing layer 97a is not particularly limited, but, for example, is preferably 0.5 μm or more and 2.0 μm or less. In addition, the thickness of the second sealing layer 97b is not particularly limited, but, for example, is preferably 0.1 μm or more and 1.0 μm or less. The first sealing layer 97a and the second sealing layer 97b are made to have such thicknesses and thereby it is possible to further reliably seal the through holes 961 and to prevent excessive thickening of the sealing layer 97. In addition, it is possible to sufficiently reinforce the lid portion 9b and to reduce deflection of the lid portion 9b.

Diaphragm Forming Step

Figure 32:
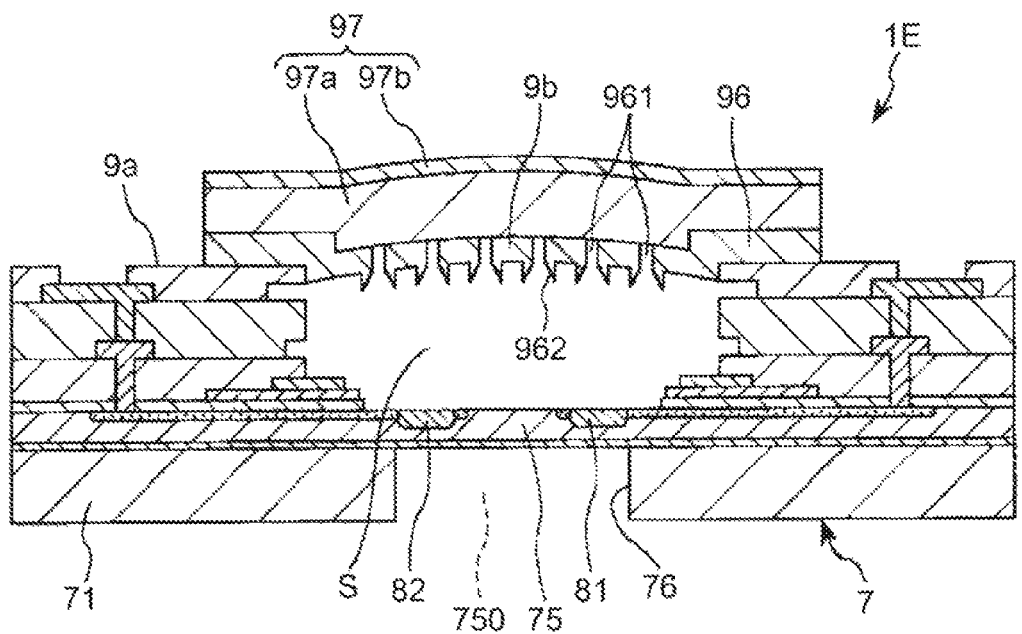
FIG. 32 is a sectional view for explaining the manufacturing method of the pressure sensor illustrated in FIG. 19.

Next, as illustrated in FIG. 32, for example, the first silicon layer 71 is etched by using a dry etching (particularly, silicon deep etching) method, the recessed portion 76 that is opened on the lower surface is formed in the diaphragm forming region 750, and the diaphragm 75 is obtained.

Therefore, the pressure sensor 1E is obtained. According to such a manufacturing method, it is possible to easily form the pressure sensor 1E in which contact between the lid portion 9b and the diaphragm 75 can be reduced.

In addition, as described above, the side wall portion 9a, the lid portion 9b, and the sealing layer 97, which are disposed in the periphery of the cavity portion S of the surrounding structure 9, are respectively configured of the silicon-based material. Therefore, it is possible to effectively reduce the temperature hysteresis and to achieve high detection accuracy of the pressure. Here, in the pressure sensor 1E that is finally obtained, a material such as aluminum of which the thermal expansion coefficient is greatly different from that of the silicon-based material is not disposed in the periphery of the cavity portion S, but during manufacturing of the pressure sensor 1E, aluminum is frequently used, for example, when forming the second sacrificial layer 62 and the like. Therefore, for example, the semiconductor circuits (transistors, resistors, and the like) are simultaneously and easily built in the pressure sensor 1E and the manufacture of the pressure sensor 1E in which the semiconductor circuits are built are easily performed.

Moreover, in the manufacturing method of the embodiment, the diaphragm forming step is finally performed, but the order of the diaphragm forming step is not particularly limited, and, for example, may be performed after the preparing step.

Seventh Embodiment

Next, a pressure sensor according to a seventh embodiment of the invention will be described.

Figure 33:
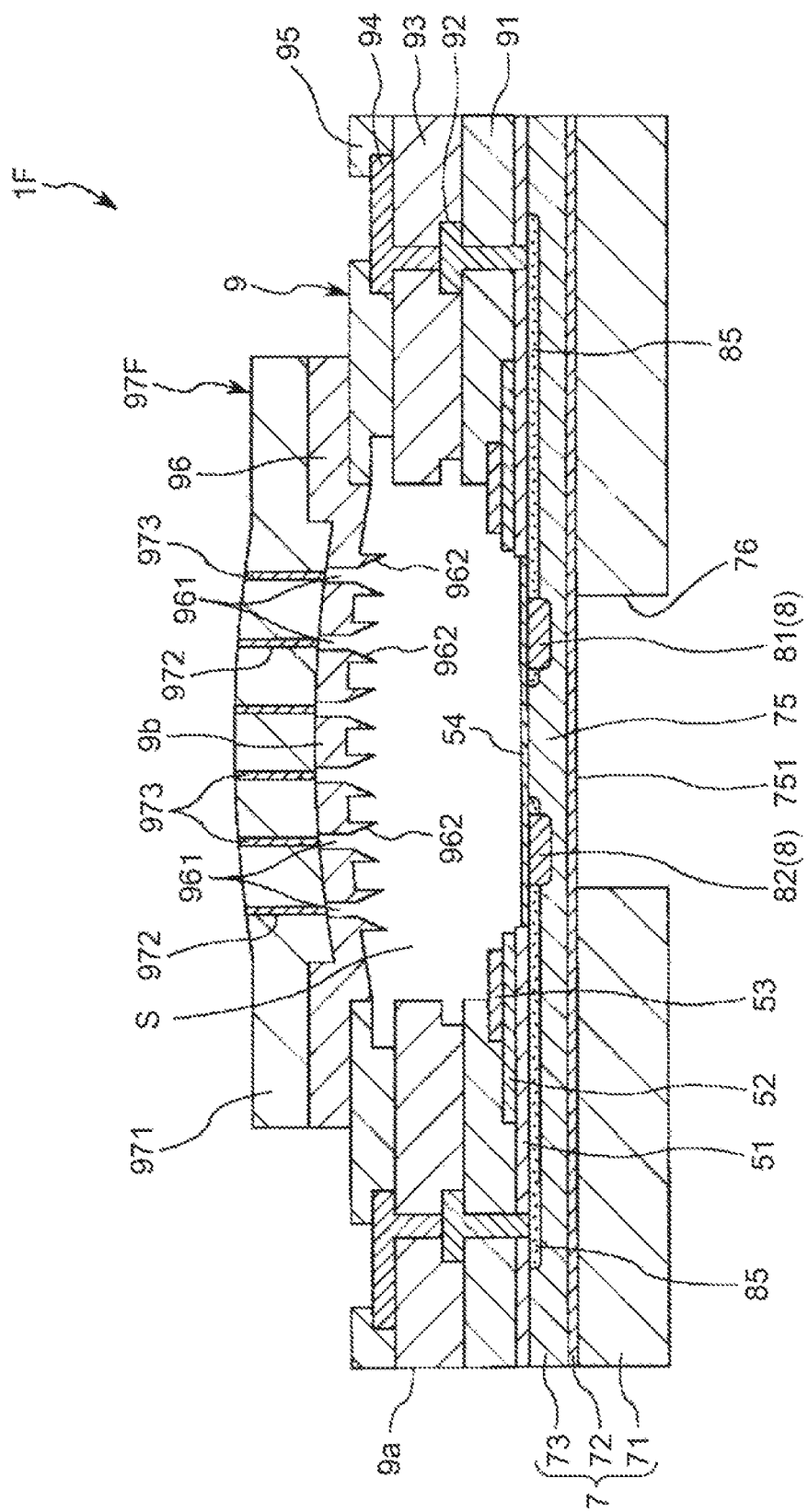
FIG. 33 is a sectional view of a pressure sensor according to a seventh embodiment of the invention.
Figure 34:
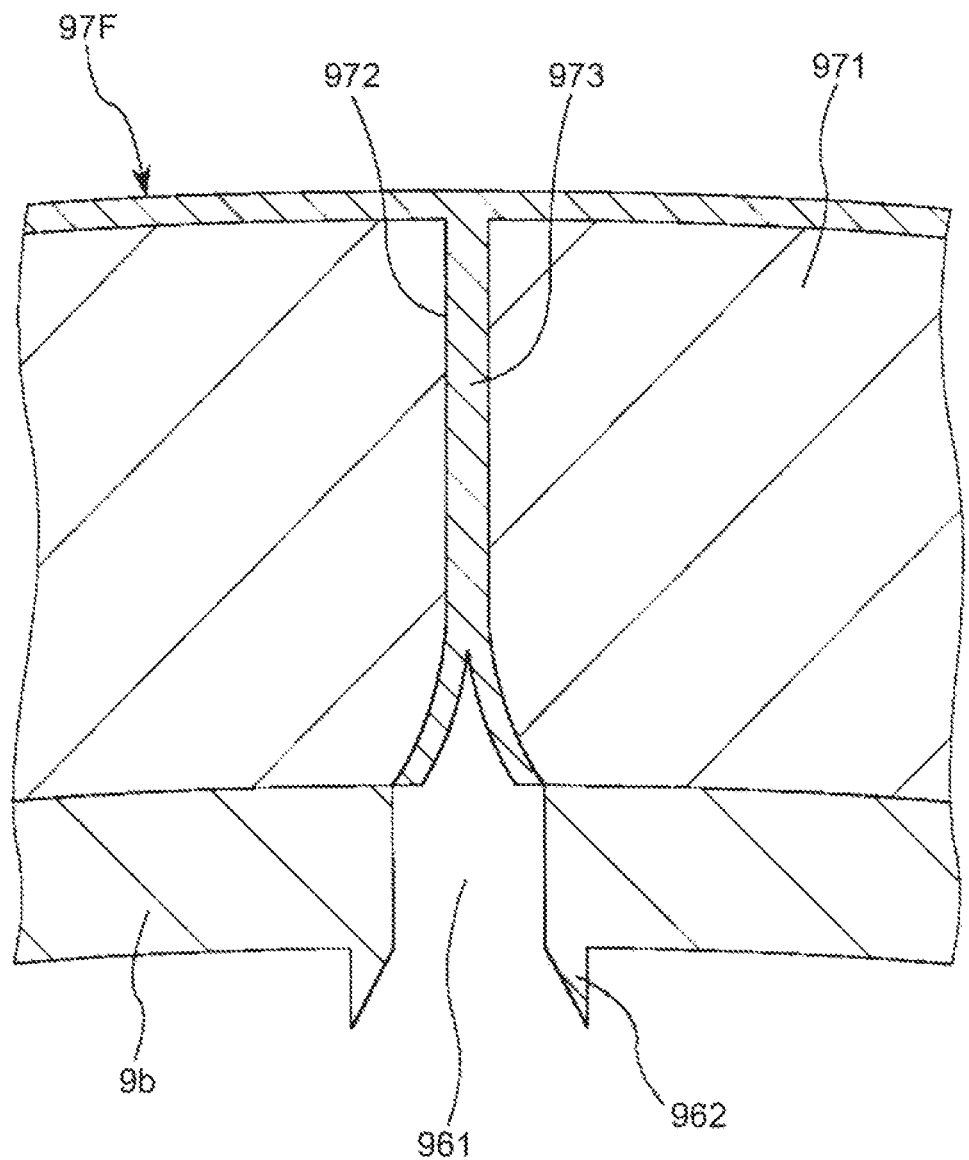
FIG. 34 is a partially enlarged sectional view of the pressure sensor illustrated in FIG. 33.
Figure 35:
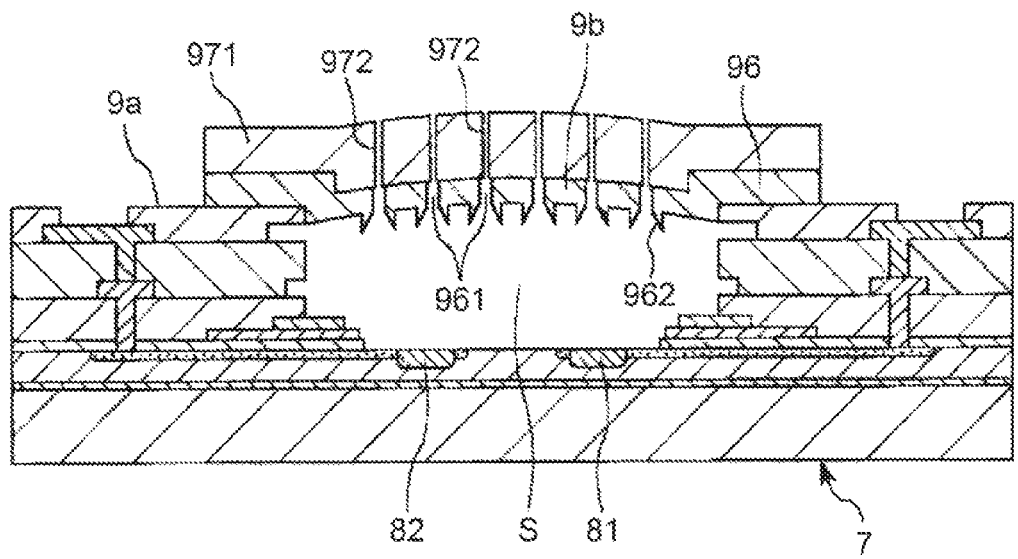
FIG. 35 is a sectional view for explaining a manufacturing method of the pressure sensor illustrated in FIG. 33.
Figure 36:
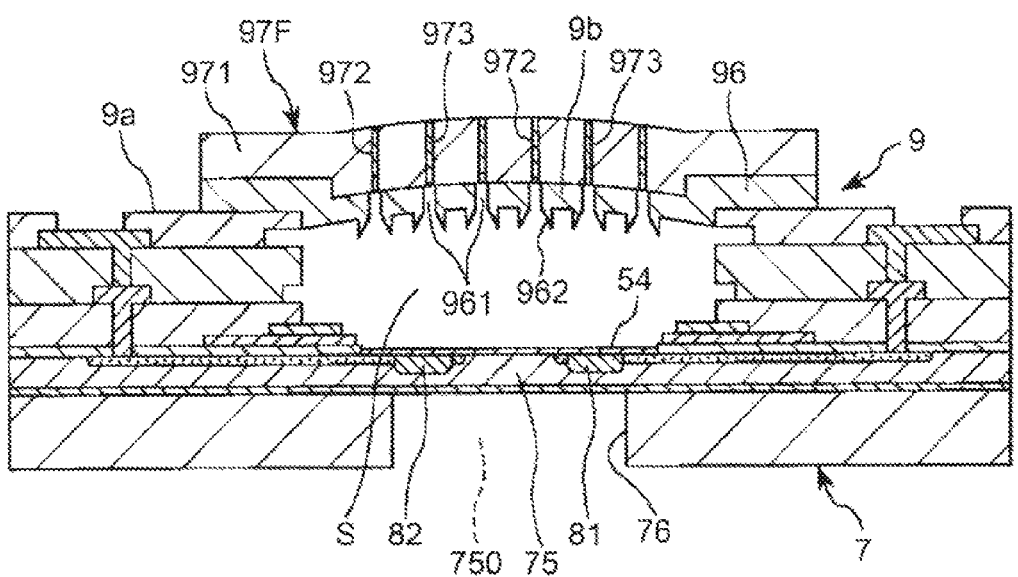
FIG. 36 is a sectional view for explaining the manufacturing method of the pressure sensor illustrated in FIG. 33.

FIG. 33 is a sectional view of the pressure sensor according to the seventh embodiment of the invention. FIG. 34 is a partially enlarged sectional view of the pressure sensor illustrated in FIG. 33. FIGS. 35 and 36 are a sectional views for explaining a manufacturing method of the pressure sensor illustrated in FIG. 33.

The pressure sensor according to the embodiment is the same as the pressure sensor of the sixth embodiment described above except that mainly the configuration of the sealing layer is different.

Hereinafter, the pressure sensor of the seventh embodiment will be described focusing on differences from the embodiment described above and the same reference numerals are given to the same matters and configurations, and description thereof will be omitted.

As illustrated in FIGS. 33 and 34, in a pressure sensor 1F of the embodiment, a sealing layer 97F is formed. The sealing layer 97F has a base portion 971 having through holes 972 (the sealing layer through holes) that communicate with the through holes 961 (the lid portion through holes) and sealing portions 973 that are disposed within the through holes 972 and seal the through holes 972. Such a configuration is provided and thereby a configuration of the sealing layer 97F becomes relatively simple.

In addition, the base portion 971 contains silicon and, particularly, in the embodiment, is configured of silicon. In addition, the sealing portions 973 contain at least one of silicon oxide, silicon nitride, and silicon oxynitride, and, particularly, in the embodiment, are configured of silicon oxide. Therefore, the sealing layer 97F is easily formed by a semiconductor process. Particularly, if the sealing portions 973 are configured of silicon oxide, the sealing portions 973 can be easily formed by oxidizing the base portion 971.

A shape of the through hole 972 is not particularly limited, but is preferably circular. A diameter (width) of such a through hole 972 is not particularly limited, but, for example, is preferably 500 angstroms or more and 1,500 angstroms or less, and is further preferably 900 angstroms or more and 1,100 angstroms or less. The through hole 972 is made to have such a diameter and thereby the through holes 972 can be further reliably sealed by the sealing portions 973 that are formed within the through holes 972, for example, by oxidation. In addition, since it takes some time for the thermal oxidation, a silicon oxide film 54 can be formed on an upper surface of a diaphragm 75 during this time. Therefore, an interface order of piezo-resistance elements 81, 82, 83, and 84 can be stabilized.

Moreover, unlike the embodiment, in a case where the sealing portions 973 are configured of silicon nitride, for example, a cavity portion S can be reliably protected from moisture and in a case where the sealing portions 973 are configured of silicon oxynitride, it is possible to achieve both the effect that is obtained by silicon oxide and the effect that is obtained by silicon nitride described above.

Next, a manufacturing method of the pressure sensor 1F will be described. Similar to the sixth embodiment described above, the manufacturing method of the pressure sensor 1F includes a preparing step, a pressure sensor portion forming step, a first sacrificial layer disposing step, a second sacrificial layer disposing step, a first sacrificial layer removing step, a lid portion disposing step, a second sacrificial layer removing step, a sealing step, and a diaphragm forming step. Moreover, since the manufacturing method is the same as the manufacturing method of the sixth embodiment described above except the sealing step, hereinafter, only the sealing step will be described.

Sealing Step

First, as illustrated in FIG. 35, the base portion 971 is formed on the covering layer 96 by using a sputtering method, a CVD method, or the like. In this case, the through holes 961 of the lid portion 9b cannot be completely filled with the base portion 971 and the through holes 972 communicating with the through holes 961 are formed in the base portion 971. Here, although it varies depending on a film forming device and film forming conditions, if the diameter of the through hole 961 is approximately 0.5 μm, the through hole 972 having the diameter of approximately 1000 angstroms (0.1 μm) is obtained. In addition, the thickness of the base portion 971 is not particularly limited, but, for example, is preferably 2 μm or more and 10 μm or less. With such a thickness, the base portion 971 has the thickness suitable for forming the through holes 972 and excessive thickening of the base portion 971 can be prevented. In addition, it is possible to sufficiently reinforce the lid portion 9b and to reduce deflection of the lid portion 9b.

Moreover, the through holes 972 may not be formed in the base portion 971 depending on the film forming device, the film forming conditions, the diameter of the through hole 961, and the thickness of the base portion 971, but in this case, the through holes 972 may be formed, for example, by using an etching method after the base portion 971 is formed.

Next, the base portion 971 is oxidized in a state where the cavity portion S is in the vacuum state. Therefore, as illustrated in FIG. 36, the sealing portions 973 formed of silicon oxide are formed on inner peripheral surfaces of the through holes 972 and the through holes 972 are sealed by the sealing portions 973. In addition, at the same time, the silicon oxide film 54 is formed on the upper surface of the diaphragm 75 and thereby the interface order of the piezo-resistance elements 81, 82, 83, and 84 can be stabilized. Moreover, an oxidation method is not particularly limited, but particularly, an ozone oxidation method is preferably used. According to the ozone oxidation method, since a heating temperature can be suppressed to approximately 500° C., a thermal history can be reduced. In addition, since melting of aluminum and the like can be prevented, it is suitable for manufacturing the pressure sensor 1E.

Thus, the sealing layer 97F is obtained and thereby the cavity portion S that is sealed in the vacuum state is obtained. According to such a manufacturing method, it is possible to easily form the pressure sensor 1F in which contact between the lid portion 9b and the diaphragm 75 can be reduced.

Even with such a seventh embodiment, it is possible to achieve the same effects as those of the sixth embodiment described above.

Eighth Embodiment

Next, an altimeter according to an eighth embodiment of the invention will be described.

Figure 37:
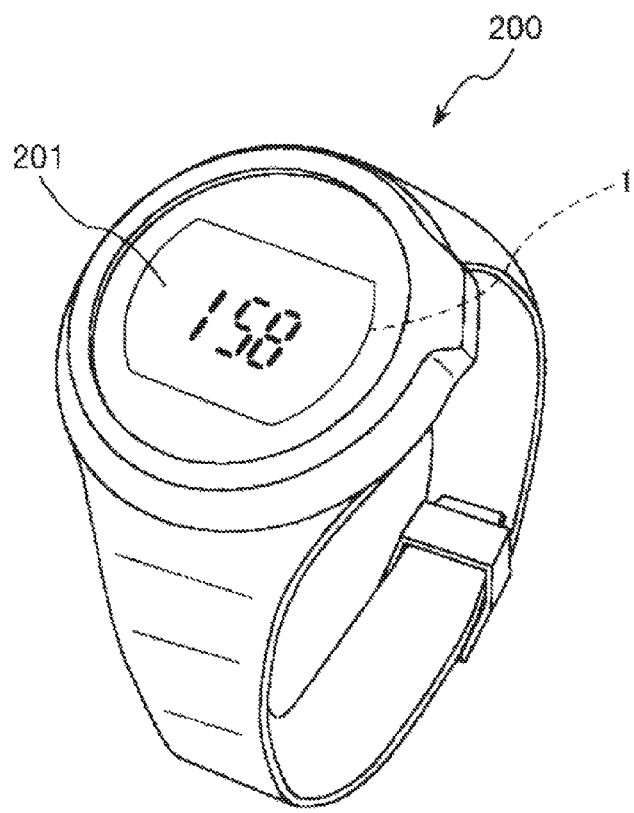
FIG. 37 is a perspective view illustrating an example of an altimeter according to an eighth embodiment of the invention.

FIG. 37 is a perspective view illustrating an example of the altimeter according to the invention.

An altimeter 200 illustrated in FIG. 37 can be worn on a wrist like a wrist watch. In addition, a pressure sensor 1 is mounted on an inside of the altimeter 200 and it is possible to display an altitude from the sea level of a current location, an atmospheric pressure of the current location, or the like in display portion 201. Moreover, in addition, it is possible to display various kinds of information such as a current time, a heart rate of a user, and weather in the display portion 201.

Since such an altimeter 200 includes the pressure sensor 1 that is excellent in the detection accuracy, it is possible to achieve high reliability. Moreover, although the embodiment is described by using a configuration including the pressure sensor 1 of the first embodiment, it is possible to achieve the same high reliability even if an altimeter including any one of the pressure sensors 1A to 1F of the other embodiments is provided.

Ninth Embodiment

Next, an electronic apparatus according to a ninth embodiment of the invention will be described.

Figure 38:
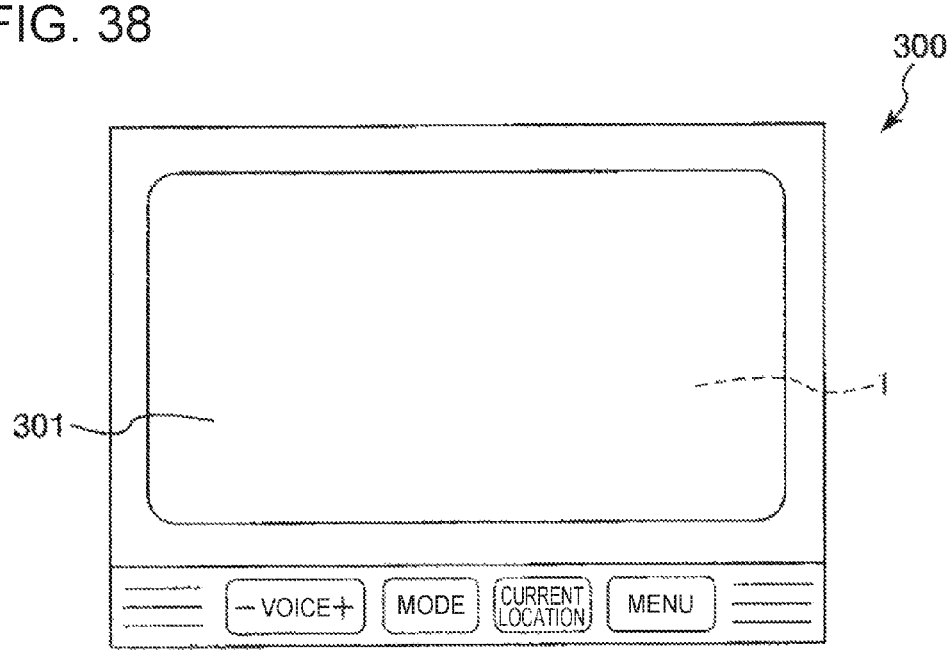
FIG. 38 is a front view illustrating an example of an electronic apparatus according to a ninth embodiment of the invention.

FIG. 38 is a front view illustrating an example of the electronic apparatus according to the invention.

The electronic apparatus illustrated in FIG. 38 is a navigation system 300 including a pressure sensor 1. The navigation system 300 includes a position information acquiring unit from map information (not illustrated) and Global Positioning System (GPS), an autonomous navigation unit based on a gyro sensor, an acceleration sensor, and a vehicle speed data, the pressure sensor 1, and a display portion 301 that displays predetermined position information or course information.

According to the navigation system 300, it is possible to acquire altitude information by the pressure sensor 1 in addition to the acquired position information.

For example, in a case where traveling is performed on an elevated road indicating a substantially same position as that of a general road on the position information, in a navigation system without altitude information, it cannot determine whether traveling is performed on the general road or on the elevated road, and information of the general road is provided to a user as priority information.

Therefore, the pressure sensor 1 is mounted on the navigation system 300, the altitude information is acquired by the pressure sensor 1, and thereby it is possible to detect an altitude change due to entering (or vice versa) from the general road to the elevated road. The navigation system 300 detects the altitude change and thereby it can determine whether traveling is performed on the general road or on the elevated road, and it is possible to provide navigation information in an actual traveling state to the user even during traveling on the elevated road.

Since such a navigation system 300 includes the pressure sensor 1 that is excellent in detection accuracy, it is possible to achieve high reliability. Moreover, although the embodiment is described by using a configuration including the pressure sensor 1 of the first embodiment, it is possible to achieve the same high reliability even if an electronic apparatus including any one of the pressure sensors 1A to 1F of the other embodiments is provided.

Moreover, the electronic apparatus including the pressure sensor according to the invention is not limited to the navigation system described above and can be applied to, for example, a personal computer, a mobile phone, a smartphone, a tablet terminal, a clock (including a smart watch), a medical device (for example, an electronic thermometer, a blood pressure monitor, a blood glucose meter, an electrocardiogram measuring device, an ultrasonic diagnostic device, and an electronic endoscope), various measuring instruments, meters (for example, meters for a vehicle, an aircraft, and a ship), a flight simulator, and the like.

Tenth Embodiment

Next, a moving object according to a tenth embodiment of the invention will be described.

Figure 39:
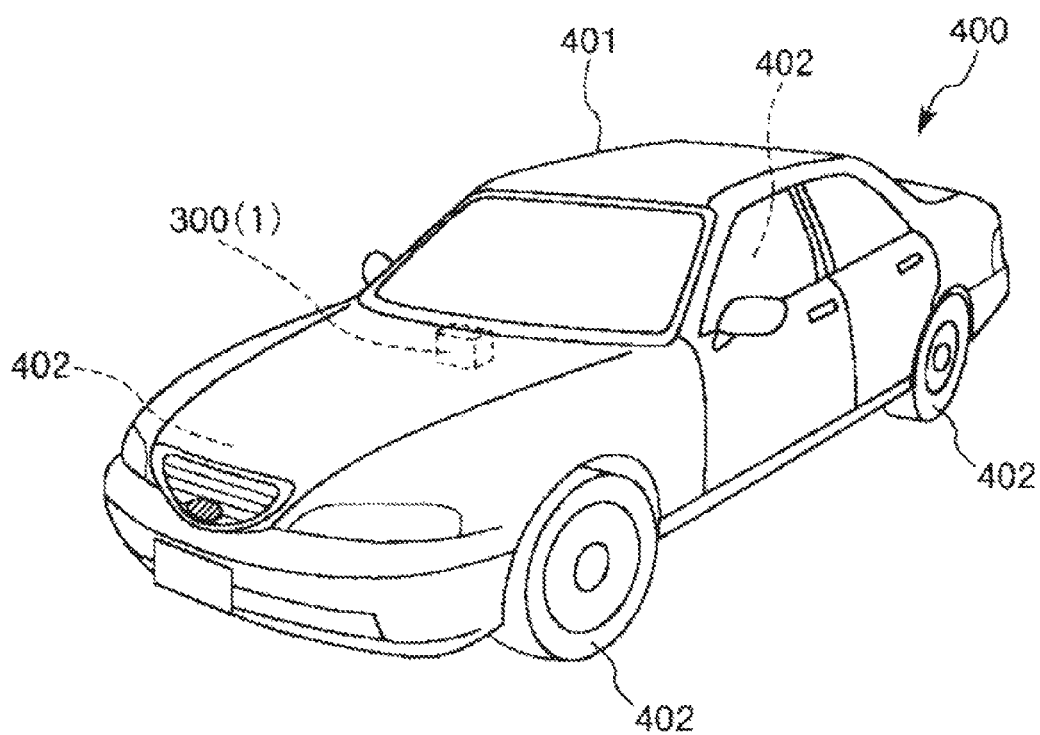
FIG. 39 is a perspective view illustrating an example of a moving object according to a tenth embodiment of the invention.

FIG. 39 is a perspective view illustrating an example of the moving object according to the invention.

The moving object illustrated in FIG. 39 is an automobile 400 including a navigation system 300. The automobile 400 has a vehicle body 401 and four wheels 402, and is connected to rotate the wheels 402 using a power source (engine) (not illustrated) provided in the vehicle body 401.

Since such an automobile 400 includes the navigation system 300 in which a pressure sensor 1 having excellent detection accuracy is built, it is possible to achieve high reliability. Moreover, although the embodiment is described by using a configuration including the pressure sensor 1 (navigation system 300) of the first embodiment, it is possible to achieve the same high reliability even if an moving object including any one of the pressure sensors 1A to 1F of the other embodiments is provided.

Although the pressure sensor, the manufacturing method of the pressure sensor, the altimeter, the electronic apparatus, and the moving object according to the invention are described above based on each illustrated embodiment, the invention is not limited to these embodiments and the configuration of each portion can be replaced by an arbitrary configuration having the same function. In addition, other optional components and steps may be added. In addition, each embodiment may be appropriately combined.

In addition, although the above embodiments are described by using the piezo-resistance element as the pressure sensor portion, the pressure sensor is not limited to the embodiments and, for example, a configuration using a flap type vibrator, other MEMS vibrators such as comb-teeth electrodes, and a vibrating element such as a crystal vibrator can be used.

In addition, although the above embodiments are described for the configuration in which the surrounding structure has the two-stage wiring layer, the number of the wiring layers may be three stages or more. Moreover, in this case, for example, the covering layer may be formed by the uppermost wiring layer.

The entire disclosures of Japanese Patent Application Nos. 2016-014062, filed Jan. 28, 2016 and 2016-049893, filed Mar. 14, 2016 are expressly incorporated by reference herein.

What is claimed is:

1. A pressure sensor comprising:
   a substrate that has a diaphragm;
   a pressure reference chamber that is positioned on one side of the diaphragm; and
   a ceiling that is disposed to face the diaphragm via the pressure reference chamber, the ceiling being configured with a covering layer and a sealing layer, the covering layer covering the pressure reference chamber, the covering layer having a plurality of through holes, the sealing layer being disposed on the covering layer so as to seal the plurality of through holes,
   wherein unevenness is formed on a surface of the substrate facing the pressure reference chamber, and
   wherein the unevenness is formed corresponding to a disposition of the plurality of through holes in a plan view.

2. The pressure sensor according to claim 1,
   wherein the unevenness has a plurality of recesses, and
   wherein the plurality of recesses are formed on the surface of the substrate facing the pressure reference chamber.

3. The pressure sensor according to claim 1,
   wherein a piezo-resistance element is disposed in the diaphragm.

4. The pressure sensor according to claim 3,
   wherein the surface of the substrate facing the pressure reference chamber has a first region in which the unevenness is formed and a second region in which the unevenness having a density lower than that of the first region is formed, and
   wherein the piezo-resistance element is disposed over a boundary between the first region and the second region.

5. The pressure sensor according to claim 3,
   wherein the surface of the substrate facing the pressure reference chamber has a first region in which the unevenness is formed and a second region in which the unevenness is not formed, and
   wherein the piezo-resistance element is disposed over a boundary between the first region and the second region.

* * * * *